(12) United States Patent
Waki et al.

(10) Patent No.: US 6,509,597 B2
(45) Date of Patent: Jan. 21, 2003

(54) FERROELECTRIC MEMORY DEVICE

(75) Inventors: Hiromichi Waki, Tokyo (JP); Keiichi Yoshizumi, Hamura (JP); Mitsuhiro Mori, Moriyamachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/939,738

(22) Filed: Aug. 28, 2001

(65) Prior Publication Data

US 2002/0042185 A1 Apr. 11, 2002

(30) Foreign Application Priority Data

Oct. 5, 2000 (JP) ........................................ 2000-305614

(51) Int. Cl.[7] ................. H01L 27/108; H01L 29/76; H01L 29/94; H01L 31/119
(52) U.S. Cl. ..................... 257/296; 257/303; 257/310
(58) Field of Search ................... 257/295, 303, 257/306, 310, 296; 438/3, 240

(56) References Cited

U.S. PATENT DOCUMENTS

| | | | | |
|---|---|---|---|---|
| 5,902,131 A | * | 5/1999 | Argos et al. | 438/240 |
| 5,965,942 A | * | 10/1999 | Itoh et al. | 257/295 |
| 6,010,927 A | * | 1/2000 | Jones et al. | 438/210 |
| 6,337,496 B2 | * | 1/2002 | Jung | 257/295 |

FOREIGN PATENT DOCUMENTS

| | | |
|---|---|---|
| JP | 8-55850 | 3/1995 |
| JP | 10-163437 | 8/1997 |
| JP | 11-135736 | 10/1997 |
| JP | 10-321811 | 5/1998 |

* cited by examiner

*Primary Examiner*—Long Pham
*Assistant Examiner*—Hoai Pham

(57) ABSTRACT

A shielding film having a higher lead content than that of a capacitive insulating film is formed under a lower electrode of a capacitor in a FeRAM memory cell, and another shielding film having a higher lead content than that of the capacitive insulating film is formed on an upper electrode. PZT films to be used as barrier layers are formed in the interlayer insulating films of the FeRAM memory cell. As a result, it is possible to prevent $H_2$ or $H_2O$ from entering an upper portion or a lower portion of the capacitor, and lead diffused from the capacitive insulating film can be compensated by lead included in the shielding films, and it is possible to prevent characteristics of the capacitive insulating film from being degraded.

5 Claims, 27 Drawing Sheets

FERROELECTRIC MEMORY DEVICE

BACKGROUND OF THE INVENTION

The present invention relates to a semiconductor integrated circuit device and a manufacturing technique therefor. More specifically, the present invention relates to a technique effectively applicable to a FeRAM (Ferroelectric Random Access Memory).

A ferroelectric random access memory (FeRAM) is a nonvolatile memory using a binary characteristic of the polarization state of PZT ($Pb(Zr_yTi_z)O_3$) or the like which is a ferroelectric substance. A memory cell of this FeRAM consists of one memory cell selection MISFET and one information capacitor. A PZT film is used as the capacitive insulating film of the capacitor.

Since the ferroelectric substance such as a PZT film contains much oxygen liable to cause reaction, the characteristic of the ferroelectric substance tends to be degraded by various treatments conducted in manufacturing steps.

For example, Japanese Patent Laid-open No. 8-55850 and No. 10-321811 describe a technique for preventing a reaction with oxygen by forming a hydrogen barrier layer.

Japanese Patent Laid-open No. 10-163437 describes a technique for preventing the reaction of oxygen contained in a capacitive insulating film constituting a capacitive element by covering the upper surface of the capacitive element with a sacrificial protection film.

Japanese Patent Laid-open No. 11-135736 describes a technique for preventing the degradation of a ferroelectric substance and a high-dielectric-constant material due to a reduction atmosphere by covering an overall capacitive element with a hydrogen barrier film.

SUMMARY OF THE INVENTION

Inventors of the present invention have developed the capacitive element of an FeRAM. The polarization characteristic of this ferroelectric film is degraded by the presence of either $H_2$ (hydrogen) or $H_2O$ (water).

One of the causes of the occurrence of either hydrogen or $H_2O$ is the presence of an interlayer insulating film. That is, in the formation of a silicon oxide film, a silicon nitride film or the like by a plasma CVD (Chemical Vapor Deposition) method, hydrogen or $H_2O$ is generated during the reaction of material gas. In addition, the hydrogen or $H_2O$ is contained in the silicon oxide film. Besides, if a silicon oxide film is formed by performing heat treatment for an SOG film, hydrogen or $H_2O$ is generated by this heat treatment.

On the other hand, in case of an FeRAM having a peripheral circuit or a logic circuit provided around a memory cell formation region, multilayer wirings are provided if the logic circuit becomes complex.

Since interlayer insulating films are formed between these plural wirings, respectively, it is becoming more important to take measures against hydrogen or $H_2O$.

An object of the present invention is to provide a technique for preventing film quality of a ferroelectric film constituting a capacitive element from being degraded.

Another object of the present invention is to provide a technique for improving the film quality of the ferroelectric film and thereby for improving characteristics of a FeRAM memory cell.

The above and other objects and novel features of the present invention will become apparent from description of the present specification and accompanying drawings.

Of inventions disclosed by the present application, the outline of representative ones will be briefly described as follows.

(1) A semiconductor integrated circuit device according to the present invention is a semiconductor integrated circuit device having an information transfer MISFET formed on a main surface of a semiconductor substrate, and a capacitor connected in series to said information transfer MISFET, wherein it has a first shielding film formed under a lower electrode and a second shielding film formed on the upper electrode of said capacitor.

According to means as described above, the first and second shielding films can prevent $H_2$ or $H_2O$ from entering an upper or lower portions of the capacitor and prevent the characteristics of a high-dielectric-constant material or ferroelectric material (capacitive insulating film) from being degraded in the capacitor. In addition, the first and second shielding films can reduce diffusion of the components, e.g., lead included in the capacitive insulating film. The first and second shielding films may be made of lead compounds. Also, the capacitive insulating film may be made of a lead compound. If a lead composition ratio of each of the first and second shielding films is set higher than that of the capacitive iinsulating film, then lead diffused from the capacitive insulating film can be compensated by lead included in the first and second shielding films. Thereby, it is possible to prevent the characteristics of the capacitive insulating film from being degraded. The lead compound is exemplified by PZT ($Pb_x(Zr_yTi_z)O_3$) or the like. In addition, if said upper or lower electrode is covered with the first and second shielding films, for example, by forming a side wall film on the side wall of the upper or lower electrode, or the like, then the present invention becomes more effective.

(2) A semiconductor integrated circuit device according to the present invention is a semiconductor integrated circuit device having an information transfer MISFET formed on a main surface of a semiconductor substrate, and a capacitor connected in series to the information transfer MISFET, wherein it has a shielding film formed under the lower electrode of said capacitor.

According to means as described above, the shielding film can prevent $H_2$ or $H_2O$ from entering the lower portion of the capacitor and prevent the characteristics of the high-dielectric-constant material or ferroelectric material (capacitive insulating film) from being degraded in the capacitor. In addition, the shielding film can reduce diffusion of the components, e.g., lead included in the capacitive insulating film. Further, it is possible to improve the crystallinity of the capacitive insulating film on the shielding film. Since the insulating film under a region in which the capacitor is formed contains hydrogen by hydrogen annealing treatment, in particular, it is possible to prevent entry of the hydrogen. This shielding film may be made of a lead compound. Also, the capacitive insulating film may be made of a lead compound. If the lead composition ratio of the shielding film is set higher than that of the capacitive insulating film, lead diffused from the capacitive insulating film can be compensated by lead included in the shielding film. Therefore, it is possible to prevent the characteristics of the capacitive insulating film from being degraded. The lead compound is exemplified by PZT ($Pb_x(Zr_yTi_z)O_3$) or the like.

(3) A semiconductor integrated circuit device according to the present invention is a semiconductor integrated circuit device having an information transfer MISFET formed on a main surface of a semiconductor substrate, and a capacitor connected in series to the information transfer MISFET, wherein is has an interlayer insulating film formed on the information transfer MISFET and the capacitor, the interlayer insulating film which has a barrier layer made of a high-dielectric-constant material or a ferroelectric material.

According to means as described above, the barrier layer can prevent $H_2$ or $H_2O$ included in the interlayer insulating film from entering the capacitor and prevent the high-dielectric-constant material or ferroelectric material (capacitive insulating film) from being degraded in the capacitor. This barrier layer may be made of a lead compound. The lead compound is exemplified by PZT ($Pb_x(Zr_yTi_2)O_3$) or the like. This barrier layer may be amorphous. The barrier layer may be formed so as to be put between the first and second insulating films. Also, in the case where a plug is formed in the interlayer insulating film, the bottom and side portions of the plug may be covered with a conductive film having a barrier property such as a TiN film or the like. Further, the barrier layer may be formed in all the interlayer insulating films between multi-layer wirings. In addition, the barrier layer may be formed in a passivation film formed on the uppermost wiring. Besides, the barrier layer may be formed only in the memory cell formation region without being formed in the peripheral circuit region.

(4) A manufacturing method of a semiconductor integrated circuit device according to the present invention comprises the steps of: forming an information transfer MISFET formed on a main surface of a semiconductor substrate; forming an insulating film on said MISFET; and sequentially depositing a shielding film, a first conductive film, a capacitive insulating film made of a ferroelectric material, and a second conductive film on said insulating film, and patterning these films, and thereby forming, on the shielding film, a capacitor constituted by a lower electrode made of the first conductive film, a capacitive insulating film, and an upper electrode made of the second conductive film.

According to means as described above, it is possible to manufacture a semiconductor integrated circuit device capable of preventing the characteristics of the high-dielectric, constant material or ferroelectric material (capacitive insulating film) from being degraded in the capacitor. In the a case where the insulating film contains hydrogen by hydrogen annealing treatment, in particular, this hydrogen can be prevented from entering the capacitive insulating film. Also, if said insulating film is formed by a plasma CVD method or by performing heat treatment for an SOG film, it is possible to prevent entry of hydrogen or $H_2O$ generated by the treatment. Further, a shielding film may be formed even on the upper electrode. This shielding film may be made of a lead compound. The lead compound is exemplified by PZT ($Pb_x(Zr_yTi_Z)O_3$) or the like.

(5) A manufacturing method of a semiconductor integrated circuit device according to the present invention comprises the steps of: forming an information transfer MISFET and a capacitor which are formed on a main surface of a semiconductor substrate; sequentially depositing an insulating film, a barrier layer made of a high-dielectric-constant material or ferroelectric material, and a second conductive film, on the information transfer MISFET and the capacitor, and thereby forming an interlayer insulating film.

According to means as described above, it is possible to manufacture a semiconductor integrated circuit device capable of preventing the characteristics of the high-dielectric-constant material or ferroelectric material (capacitive insulating film) from being degraded in the capacitor. In the case where the insulating film is formed by a plasma CVD method or by performing heat treatment for an SOG film, in particular, the barrier layer can prevent hydrogen or $H_2O$ generated by the treatment from entering the capacitor. This barrier layer may be made of a lead compound. The lead compound is exemplified by PZT ($Pb_x(Zr_yTi_2)O_3$) or the like.

DESCRIPTION OF THE PREFERRED EMBODIMENTS

Embodiments of the present invention will be described hereinafter in detail with reference to the drawings. It is noted that constituent elements having the same functions are denoted by the same reference numbers in all the drawings for describing the embodiments of the present invention and repetitive description thereof will be omitted.

(First Embodiment)

A manufacturing method of a FeRAM, which is a first embodiment of the present invention, will be described hereinafter with reference to FIGS. 1 to 18 in order of manufacturing steps.

Figure 1:
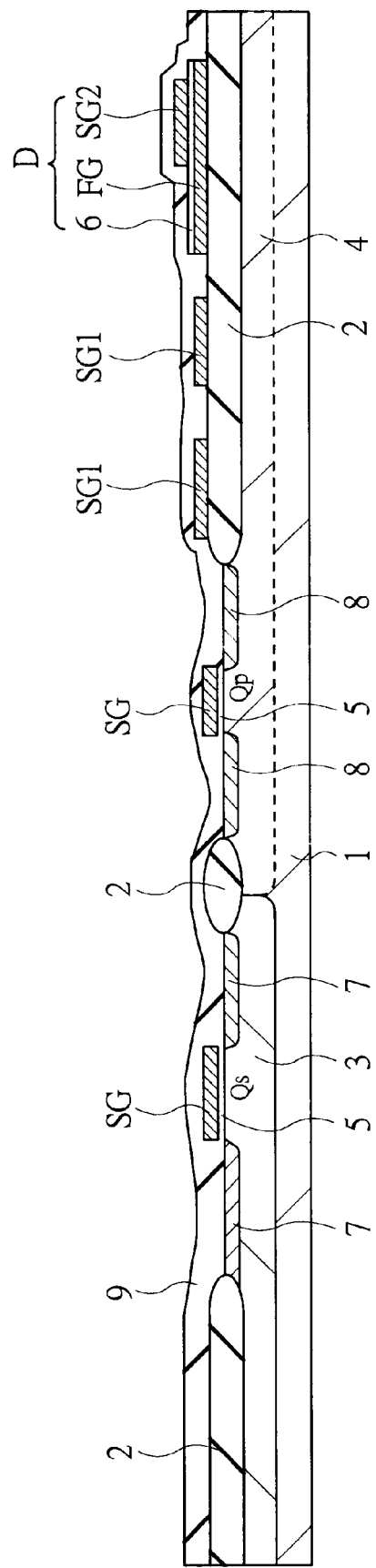
FIG. 1 is a cross-sectional view of a principal portion of a substrate for showing a manufacturing method of a semiconductor integrated circuit device that is a first embodiment of the present invention.

First, as shown in FIG. 1, a p-type well 3 and an n-type well 4 are formed in a semiconductor substrate 1 composed of an n-type mono-crystalline silicon having a resistivity of about 10 Ωcm. The p-type well 3 is formed by ion-implanting p-type impurities such as boron (B) into the semiconductor substrate 1, and then by annealing the semiconductor substrate 1 to thermally diffuse the impurities. The n-type well 4 is formed by ion-implanting n-type impurities such as phosphor (P) into the semiconductor substrate 1, and then by annealing the semiconductor substrate to thermally diffuse the impurities.

Next, a field oxide film 2 for element isolation is formed on the main surface of the semiconductor substrate 1. This field oxide film 2 is formed by a well-known LOCOS (Local Oxidation of Silicon) method.

Then, a hydrofluoric acid cleaning solvent is used to wet-cleaning the surface of the semiconductor substrate 1 (the p-type well 3 and the n-type well 4), and thereafter wet-oxidation is performed, and a clean gate oxide film 5 are formed on each surface of the p-type well 3 and the n-type well 4.

Next, a conductive layer such as a poly-crystalline silicon film is deposited on an upper portion of the gate oxide film 5, and then a silicon oxide film or the like is deposited thin and is patterned. By this, a capacitive element D having the poly-crystalline silicon film as a lower electrode FG and the silicon oxide film as a capacitive insulating film 6, is formed on the wide field oxide film 2 in the n-type well 4. An upper electrode of this capacitive element D is formed simultaneously with the gate electrodes SG of MISFETs Qs and Qp formed on the main surfaces of the p-type well 3 and the n-type well 4, respectively.

Next, a conductive film such as a poly-crystalline silicon film or the like is deposited on the upper portion of the semiconductor substrate 1 and is patterned. By this, the gate electrodes SG are formed on the main surfaces of the p-type well 3 and then-type well 4, respectively. Further, conductive layers SG1 used for wiring, resistance and the like are formed on the field oxide film 2. Also, an upper electrode SG2 is formed on the capacitive insulating film 6.

Next, n-type impurities such as phosphor (P) are ion-implanted into both sides of the gate electrode SG on the p-type well 3 to thereby form n-type semiconductor regions 7 (source and drain). Also, p-type impurities such as boron (B) are ion-implanted into both sides of the gate electrode SG on the n-type well 4 to thereby form p-type semiconductor regions 8 (source and drain). Then, a BPSG film 9 is deposited on the upper portion of the semiconductor substrate 1. It is noted that this BPSG film 9 may be used as a TEOS film or a SOG film as described later.

Thereafter, annealing is performed in hydrogen atmosphere so as to remedy defects on interfaces between each n-type semiconductor regions 7 and one of the gate oxide films 5, and between each p-type semiconductor region 8 and the other of the gate oxide films 5.

Through the above-described steps, the n-channel type MISFET Qs constituting an FeRAM and a p-channel type MISFET Qp constituting a peripheral circuit are formed.

Figure 2:
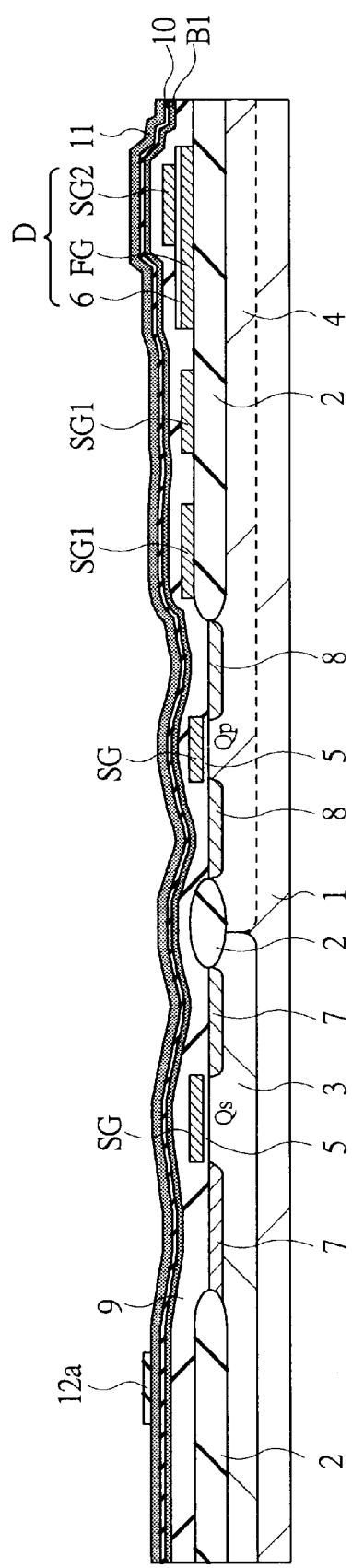
FIG. 2 is a cross-sectional view of a principal portion of a substrate for showing the manufacturing method of a semiconductor integrated circuit device that is the first embodiment of the present invention.

Next, as shown in FIG. 2, a PPZT film B1 used as a shielding film is deposited on the silicon oxide film 9 by a sputtering method. Then, a laminating film 10 composed of a Ti film and a Pt film and used as a lower electrode is deposited. A PZT film 11 is then deposited.

Composition of the PZT film will now be described. PZT is represented by Pb $(Zr_y Ti_z)O_3$ (y+z=1). Composition ratio of these atoms constituting the PZT film is introduced from a crystal structure of PZT. Pb atoms in PZT are arranged one by one in each of eight corners of a cube, and a Zr or Ti atom is located at substantially a center of the cube. Further, oxygen atoms are arranged at substantially a center of each plane of the cube. This follows that one (1/8×8) Pb atom, one Zr or Ti atom, and three (1/2×6) oxygen atoms exist in the cube. It is noted, however, that lead oxide exists in such a grain boundary.

Further, Pb atoms in PZT have a characteristic of easily volatilizing. Due to this, when the PZT film 11 is formed, an amorphous film having a Pb composition ratio of $1+\alpha_1$ is deposited. This amorphous film is crystallized by annealing performed after formation of the PZT film 11.

As will be described later in detail, the PZT film B1 formed as the shielding film has a Pb composition ratio of $1+\alpha_2$ ($\alpha_2>\alpha_1$) at the time of formation thereof in order to compensate for Pb released from the PZT film 11. While being formed, this PZT film B1 is amorphous, too.

Thereafter, annealing is performed to crystallize the PZT film 11. At this time, the PZT film B1 is crystallized, too. Then, a Pt film 12 used as an upper electrode is deposited on the PZT film 11. Subsequently, by patterning the Pt film 12, an upper electrode 12a is formed on an upper portion of the wide field oxide film 2 in the p-type well 3.

Figure 3:
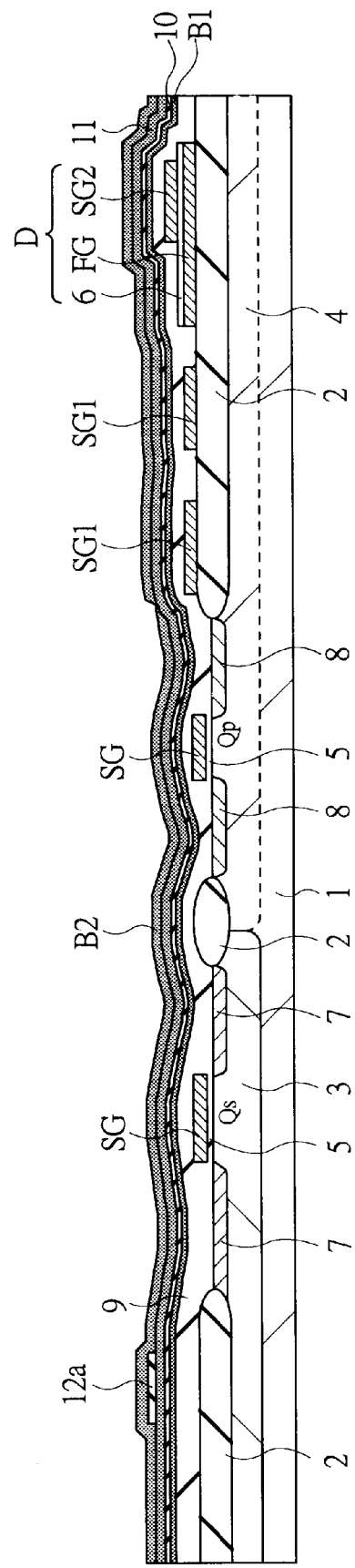
FIG. 3 is a cross-sectional view of a principal portion of a substrate for showing the manufacturing method of a semiconductor integrated circuit device that is the first embodiment of the present invention.

Next, as shown in FIG. 3, a PZT film B2 used as a shielding film is deposited on the upper electrode 12a and the PZT film 11 by the sputtering method. This PZT film B2 also has a Pb composition ratio of $1+\alpha_2$ ($\alpha_2>\alpha_1$) at the time of formation thereof in order to compensate for Pb released from the PZT film 11. The PZT film B2 too is amorphous when being formed.

Figure 4:
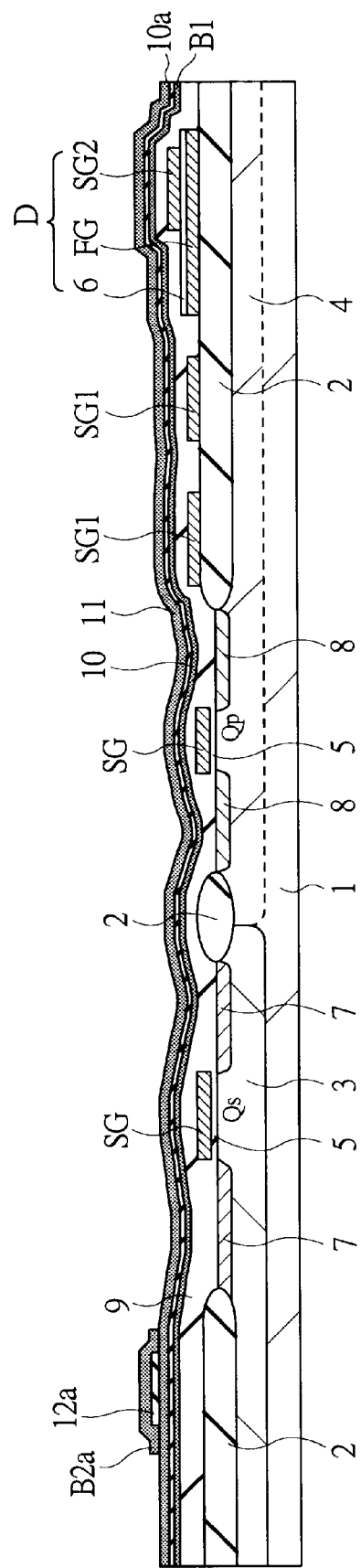
FIG. 4 is a cross-sectional view of a principal portion of a substrate for showing the manufacturing method of a semiconductor integrated circuit device that is the first embodiment of the present invention.
Figure 5:
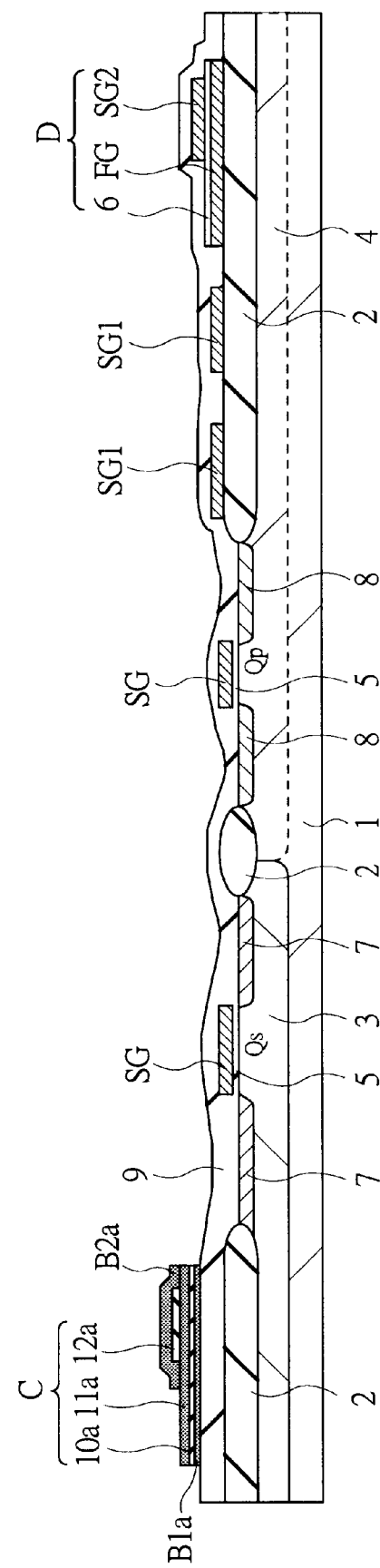
FIG. 5 is a cross-sectional view of a principal portion of a substrate for showing the manufacturing method of a semiconductor integrated circuit device that is the first embodiment of the present invention.

Next, as shown in FIG. 4, a resist film (not shown) is formed on an upper portion of the upper electrode 12a. Then, by using this resist mask as a mask and by plasma-etching the PZT film B2, a shielding film B2a is formed on the upper electrode 12a. At this time, if patterns of the shielding film B2a are formed larger than those of the upper electrode 12a, side portions of the upper electrode 12a are also covered with the shielding film B2a to thereby be capable of increasing further a shielding effect. Next, the resist film is removed by ashing. Then, annealing is performed to remedy defects of the PZT film 11 generated by plasma-etching and annealing.

Next, a resist film (not shown) is formed on upper portions of the upper electrode 12a and the periphery thereof. By using this resist film as a mask and by plasma-etching the PZT film 11, the laminating film 10 composed of both the Ti film and the PT film, and the PZT film B1, a capacitive insulating film 11a, a lower electrode 10a and a shielding film B1a are formed below the upper electrode 12a (see FIG. 5). Here, the reason why respective patterns of the capacitive insulating film 11a, the lower electrode 12a and the shielding film B1a are formed larger than patterns of the upper electrode 12a, is to ensure a connection region between the lower electrode 10a and an intermediate wiring L1 to be described later, on the lower electrode 10a. Then, the resist film is removed by ashing. Annealing is performed to remedy defects of the PZT film 11 generated by plasma-etching and annealing.

Through the above-described steps, a capacitor C constituting the FeRAM is formed. This capacitor C consists of the upper electrode 12a, the capacitive insulating film 11a and the lower electrode 10a. The shielding film B2a covers the upper portion of the upper electrode 12a. The shielding film B1a is also formed on a lower portion of the lower electrode 10a.

As can be seen, in the first embodiment, it is possible to prevent hydrogen or $H_2O$ from entering the capacitive insulating film 11a since the shielding films B1a and B2a are formed. That is, the shielding films B1a and B2a serve as barriers for preventing hydrogen or $H_2O$ from passing therethrough.

Further, if entering the PZT film, the hydrogen or the like combines with oxygen atoms and thereby film quality of the PZT film is degraded. In this embodiment, however, even if hydrogen or the like enters the shielding films B1a and B2a, then oxygen included in the shielding films B1a and B2a becomes reaction object as reacting therewith and thereby it is possible to be prevented from reacting with oxygen atoms included in the capacitive insulating film 11a. In other words, the shielding films B1a and B2a themselves become sacrifices and influence of hydrogen or the like can be therefore reduced relative to the capacitive insulating film 11a.

Furthermore, Pt used in the upper electrode 12a and the lower electrode 10a has a catalytic action to transform $H_2$ to $H^+$ (hydrogen ions). In the case where the hydrogen ions are diffused into the upper electrode 12a or the lower electrode 10a and enter the capacitive insulating film 11a, it is considered that a crystalline characteristic thereof is destroyed. In this embodiment, however, since the shielding film B2a is formed on the upper electrode 12a and the shielding film B1a is formed below the lower electrode 10a, lead oxide included in the shielding films are diffused into these electrodes 10a and 12a. This lead oxide serves as a catalyst poison and can restrain catalytic action of Pt described above. This lead oxide can be diffused into the electrodes 10a and 12a by performing heat treatment at a temperature of 550° C. or higher.

As a method for making such lead oxide serving as a catalyst poison contain in the lower electrode 10a and the upper electrode 12a, the Pt film maybe made to contain Pt oxide therein in advance during a step of forming the Pt film for providing the lower electrode 10a and the upper electrode 12a.

Meanwhile, as having already described above, since Pb has a characteristic of easily volatilizing, Pb included in the capacitive insulating film 11a is diffused and thereby defects are caused. In this embodiment, however, since the Pb composition ratio of the PZT constituting each of the shielding films B1a and B2a is set large ($\alpha_2 > \alpha_1$), it is possible to compensate for defects of Pb included in the capacitive insulating film 11a. Namely, Pb included in the shielding films B1a and B2a are supplied into the capacitive insulating film 11a through either the upper electrode 12a or the lower electrode 10a, and thereby the defects are remedied.

Furthermore, in particularly, by forming the shielding film B1a below the lower electrode 10a, influence of $H_2$ included in the BPSG film 9 generated by the above-stated hydrogen annealing can be reduced. In addition, by forming the shielding film B1a using the same material below the lower electrode 10a, it is possible to improve a crystalline characteristic of the lower electrode 10a. Additionally, in the case where the shielding film B1a is crystallized by annealing and then the capacitive insulating film is formed, it is possible to improve further the crystalline characteristic of the lower electrode 10a.

Consequently, in the first embodiment, it is possible to ensure the characteristic of the capacitive insulating film 11a and to increase a residual polarization amount Qsw. It is also possible to restrain dispersion of the residual polarization amount Qsw.

Figure 6:
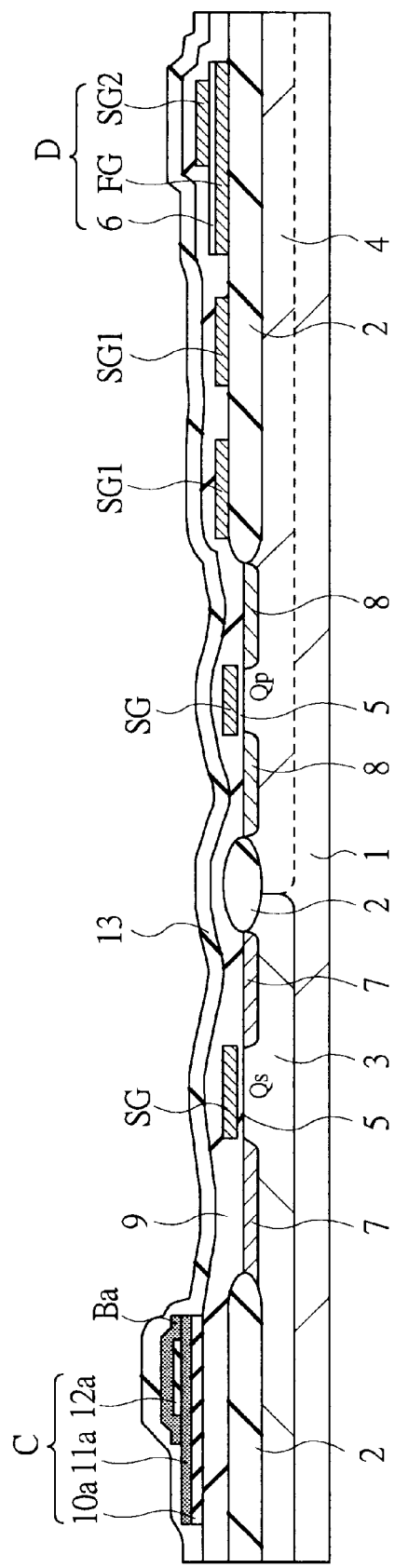
FIG. 6 is a cross-sectional view of a principal portion of a substrate for showing the manufacturing method of a semiconductor integrated circuit device that is the first embodiment of the present invention.

Next, a silicon oxide film (to be referred to as "TEOS film" hereinafter) 13 made of a material of tetraethoxysilane is deposited by a CVD method, as shown in FIG. 6.

Figure 7:
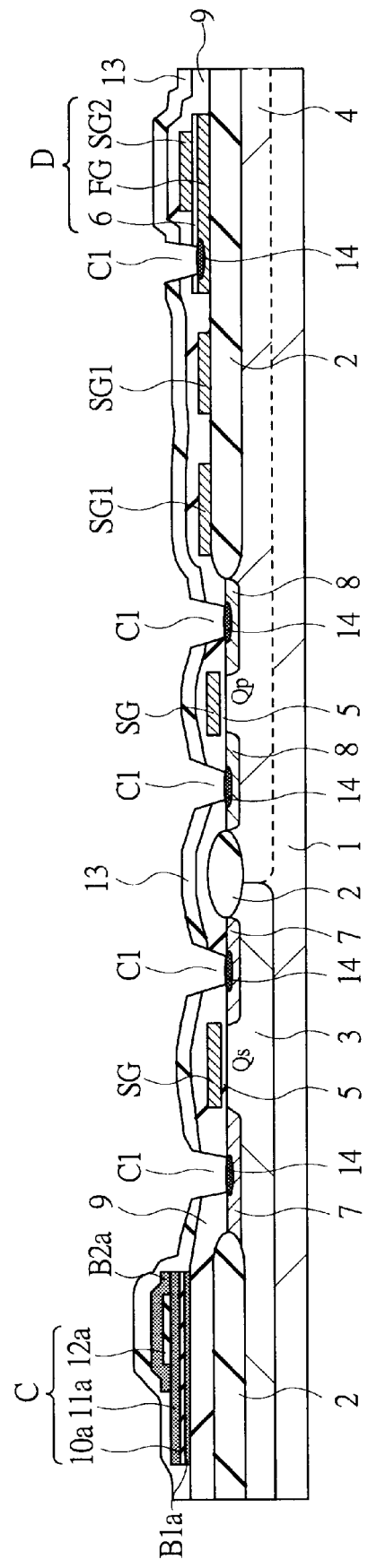
FIG. 7 is a cross-sectional view of a principal portion of a substrate for showing the manufacturing method of a semiconductor integrated circuit device that is the first embodiment of the present invention.

Subsequently, a resist film (not shown) having opening portions located on the n-type semiconductor region 7 (source and drain), the p-type semiconductor region 8 (source and drain) and the lower electrode FG of the capacitive element D, is formed on the TEOS film 13. Then, as shown in FIG. 7, by using this resist film as a mask and by plasma-etching and removing the silicon oxide films 9 and 13 located on the n-type semiconductor region 7 (source and drain) and the p-type semiconductor region 8 (source and drain), contact holes C1 are formed. The resist film is removed by ashing, and thereby a Pt film (not shown) is formed on the TEOS film 13 and in each interior of the contact holes C1. Next, silicide layers 14 are formed on contact portions between the Pt film, and each of the n-type semiconductor region 7 (source and drain) and the p-type semiconductor region (source and drain) and the lower electrode FG of the capacitive element D. The Pt film not reacted is then removed.

Figure 8:
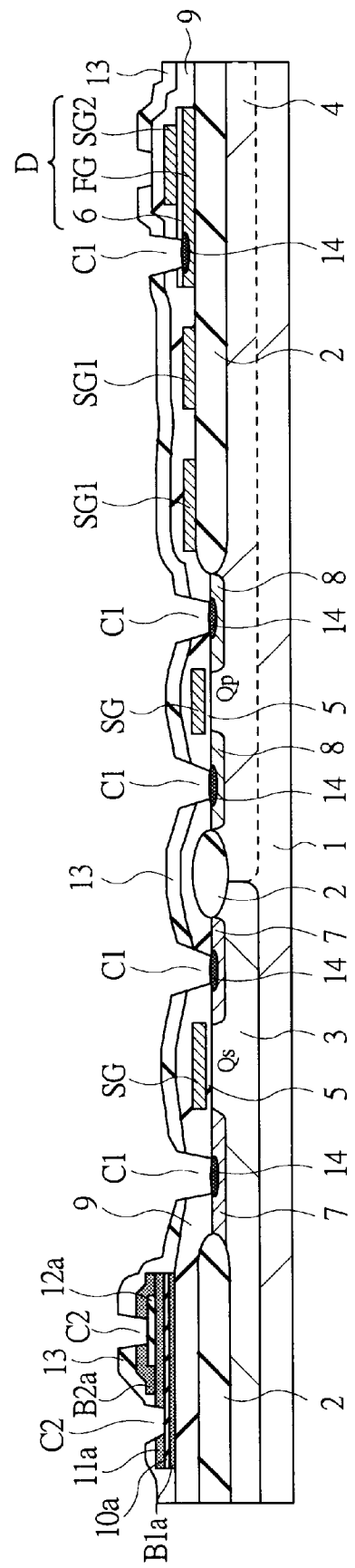
FIG. 8 is a cross-sectional view of a principal portion of a substrate for showing the manufacturing method of a semiconductor integrated circuit device that is the first embodiment of the present invention.

Next, a resist film (not shown) having opening portions located on the upper electrode 12a and the lower electrode 10a of the capacitor C is formed. Subsequently, as shown in FIG. 8, the shielding film B2a and the TEOS film 13 located on the upper electrode 12a, and the TEOS film 13 and the capacitive insulating film 11a located on the lower electrode 10a are removed by a plasma etch, and thereby contact holes C2 are formed. The resist film is removed by ashing, and is annealed in $O_2$ (oxygen) atmosphere in order to improve film quality of the PZT film.

Figure 9:
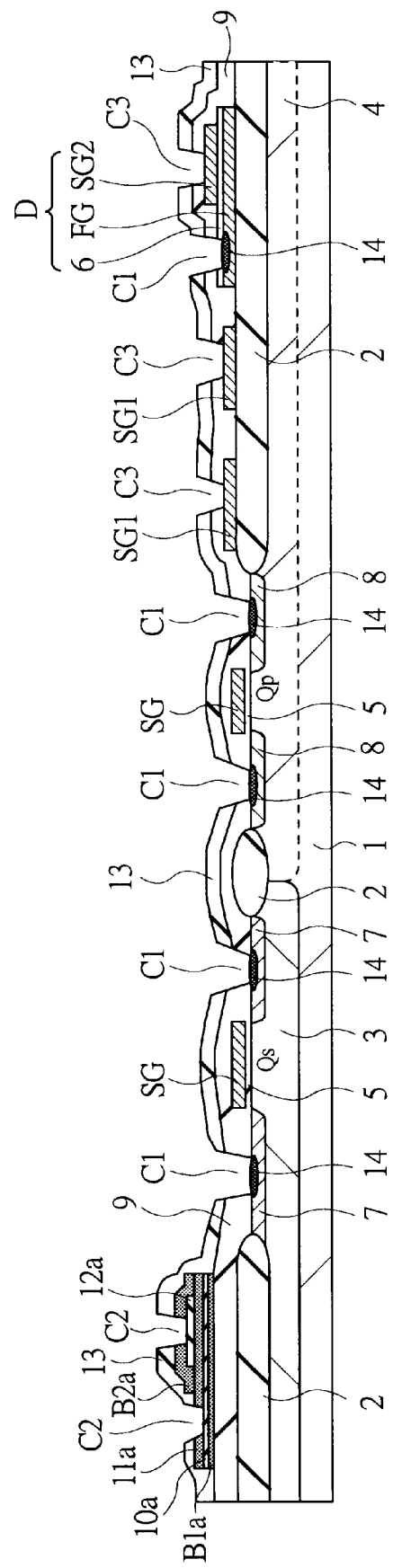
FIG. 9 is a cross-sectional view of a principal portion of a substrate for showing the manufacturing method of a semiconductor integrated circuit device that is the first embodiment of the present invention.

Subsequently, a resist film (not shown) having opening portions located on the conductive layer SG1 provided on the field oxide film 2 and on the upper electrode SG2 of the capacitive element D, is formed. Then, as shown in FIG. 9, the silicon oxide films 9 and 13 located on the conductive film SG1 and the upper electrode SG2 are removed by plasma etching, and thereby contact holes C3 is formed. The resist film is then removed by ashing.

Figure 10:
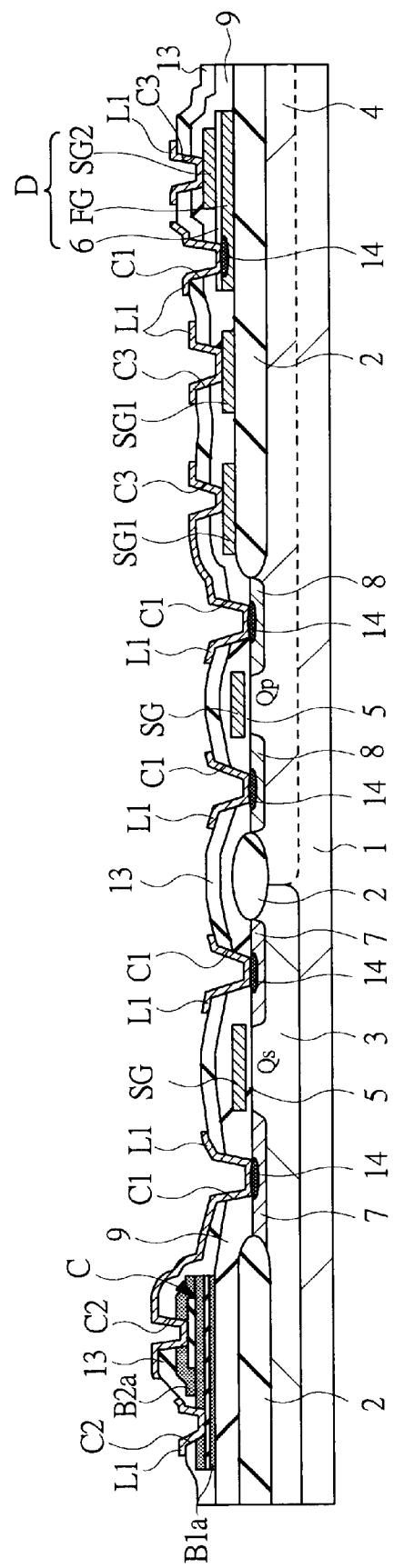
FIG. 10 is a cross-sectional view of a principal portion of a substrate for showing the manufacturing method of a semiconductor integrated circuit device that is the first embodiment of the present invention.

Next, as shown in FIG. 10, a TiN film 16 is deposited on the TEOS film 13 and in each interior of the contact holes C1, C2 and C3. The TiN film 16 is patterned to thereby form intermediate wirings L1. By the intermediate wirings L1, the n-channel type MISFETQs and the capacitor C are connected in series. Namely, the n-type semiconductor region 7 (source and drain) of the n-channel type MISFETQs and the upper electrode 12a of the capacitor C are connected by one of the intermediate wirings L1.

Figure 11:
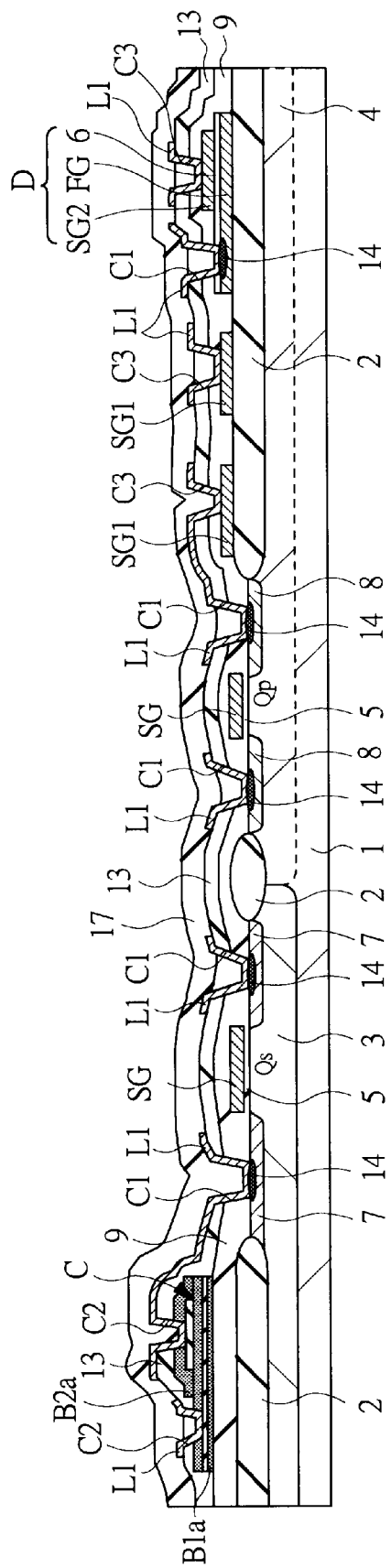
FIG. 11 is a cross-sectional view of a principal portion of a substrate for showing the manufacturing method of a semiconductor integrated circuit device that is the first embodiment of the present invention.

Next, as shown in FIG. 11, a TEOS film 17 is formed on the intermediate wirings L1 and the TEOS film 13.

Thereafter, a first to third layer wirings M1 to M3 are formed on the TEOS film 17. Now, description will be in detail given to the steps of forming these wirings and the steps of forming interlayer insulating films S1 to S3 to be provided between the wirings, respectively.

Figure 12:
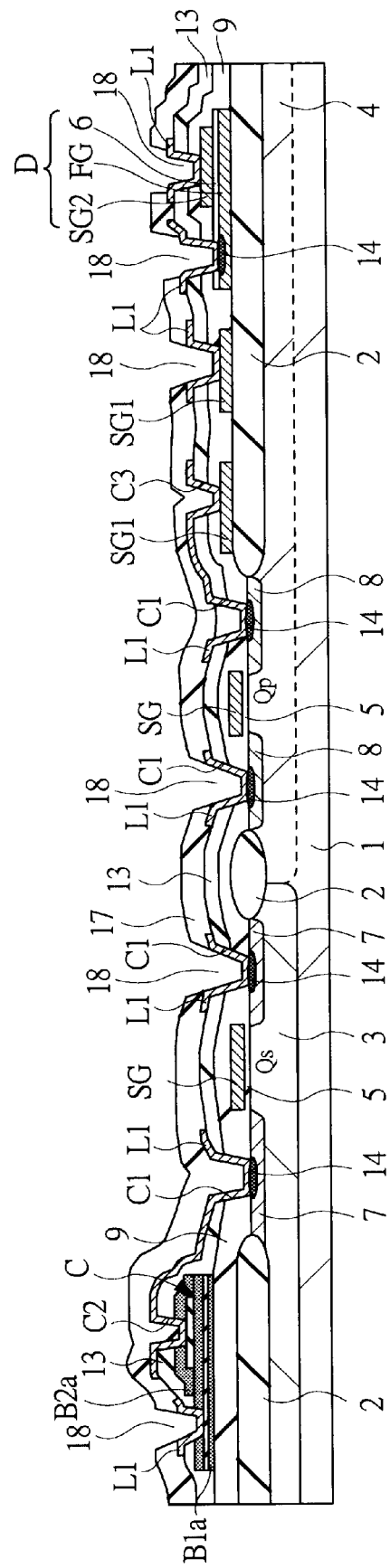
FIG. 12 is a cross-sectional view of a principal portion of a substrate for showing the manufacturing method of a semiconductor integrated circuit device that is the first embodiment of the present invention.
Figure 13:
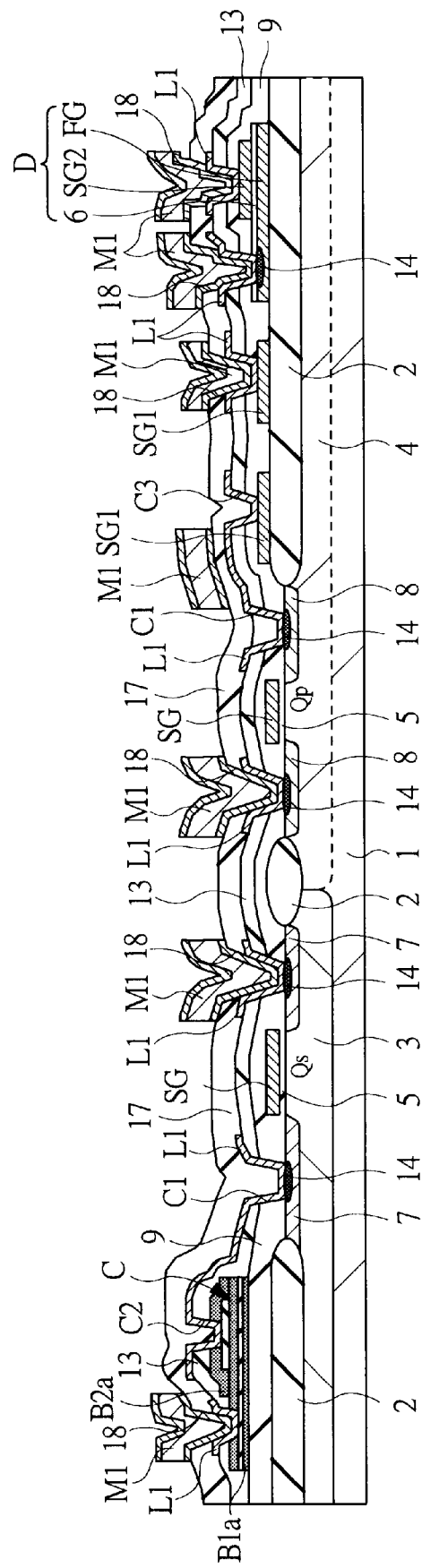
FIG. 13 is a cross-sectional view of a principal portion of a substrate for showing the manufacturing method of a semiconductor integrated circuit device that is the first embodiment of the present invention.

First, a resist film (not shown) having opening portions is formed on the TEOS film 17. The opening portions are formed, for example, on the lower electrode 10a of the capacitor C, on the n-type semiconductor region 7 (source and drain) not connected to the capacitor C of the n-channel type MISFET Qs or the p-type semiconductor region 8 (source and drain) located in a peripheral circuit region, on the electrodes FG and SG2 of the capacitive element D and the like. Next, as shown in FIG. 12, the TEOS film 17 is etched by using this resist film as a mask, and thereby contact holes 18 are formed.

Next, a TiN film, an Al film, and a TiN film are sequentially deposited on the TEOS film 17 and in each interior of the contact holes 18. These interlayer films are patterned to thereby form the first layer wirings M1 (see FIG. 13).

Figure 14:
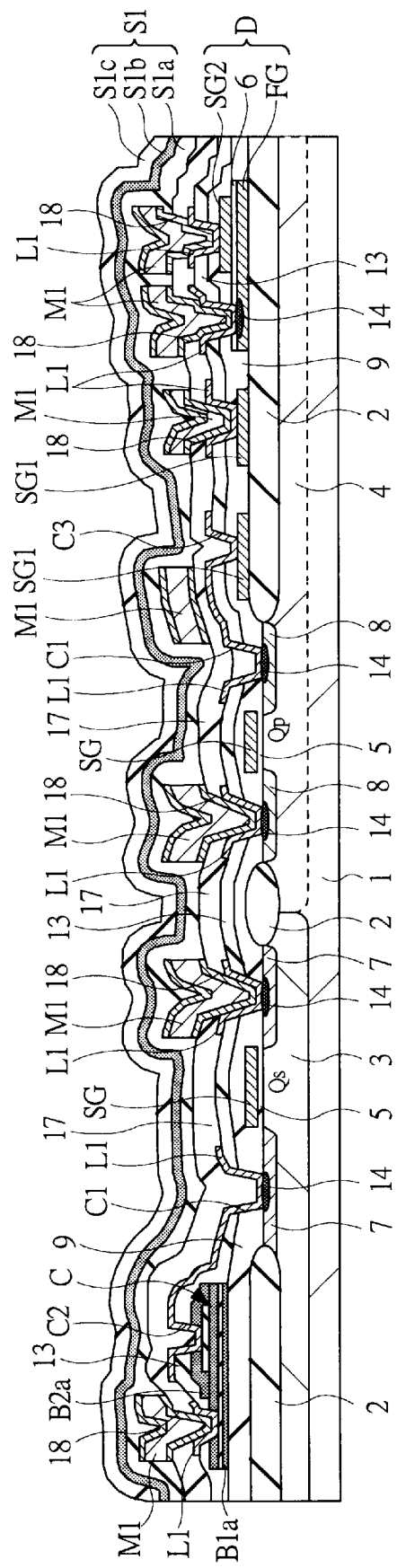
FIG. 14 is a cross-sectional view of a principal portion of a substrate for showing the manufacturing method of a semiconductor integrated circuit device that is the first embodiment of the present invention.
Figure 15:
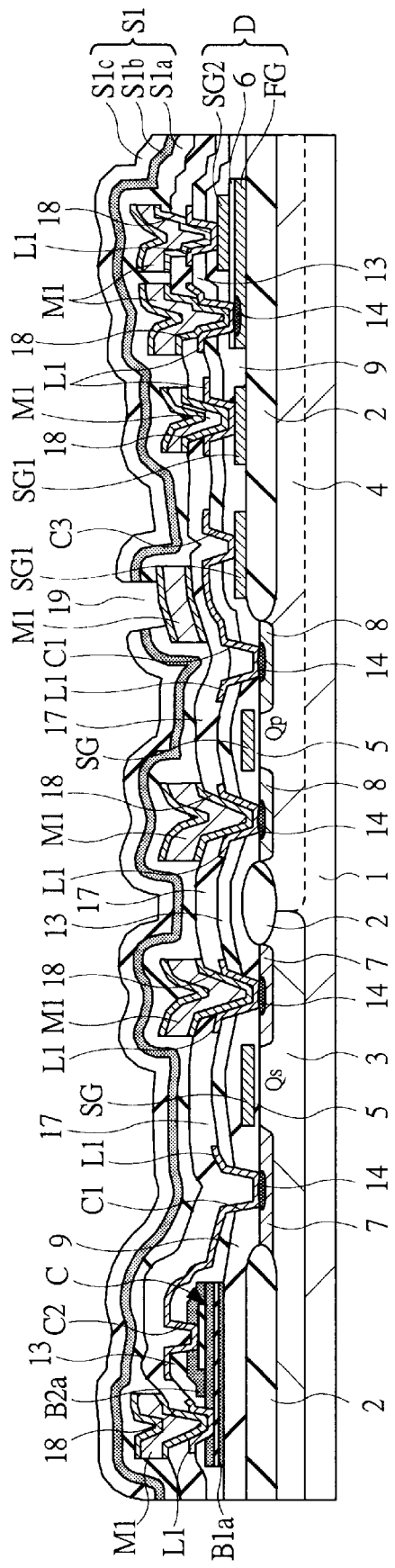
FIG. 15 is a cross-sectional view of a principal portion of a substrate for showing the manufacturing method of a semiconductor integrated circuit device that is the first embodiment of the present invention.

Subsequently, as shown in FIG. 14, a TEOS film S1a, a PZT film S1b used as a barrier film, and a TEOS film S1c are sequentially deposited on the first layer wirings M1 and the TEOS film 17, and thereby an interlayer insulating film S1 is formed, which consists of the above-stated films. The PZT film S1b is an amorphous film having a Pb composition ratio of $1+\alpha_3$. After the PZT film S1b is formed, no heat treatment is performed at high temperature. Due to this, the PZT film S1b is not crystallized but remain amorphous.

As can be seen, in this embodiment, since the PZT film S1b serving as a barrier film is formed in the interlayer insulating film S1, it is possible to prevent hydrogen or $H_2O$ from entering the capacitive insulating film 11a. That is, the PZT film S1b serves as a barrier and prevents hydrogen or $H_2O$ existing in the TEOS film S1c and a TEOS film S2a to be described later, from passing therethrough. Particularly, since the PZT film S1b is amorphous and does not have a grain boundary, it can prevent hydrogen or $H_2O$ from passing therethrough more effectively than the crystallized PZT film.

Further, since hydrogen, $H_2O$ or the like existing in the TEOS films S1a and S1c combines with oxygen atoms included in the PZT film S1b, it is possible to prevent hydrogen or $H_2O$ from entering the capacitive insulating film 11a. It is also possible to prevent a reaction to oxygen atoms included in the capacitive insulating film 11a. That is, the PZT film S1b itself becomes a sacrifice, so that it is possible to reduce the influence of hydrogen or the like relative to the capacitive insulating film 11a.

Next, a resist film (not shown) having opening portions in desired regions located on the first layer wirings M1, is formed on the interlayer insulating film S1. By using this resist film as a mask and by etching the interlayer insulating film S1, contact holes 19 are formed (see FIG. 15).

Figure 16:
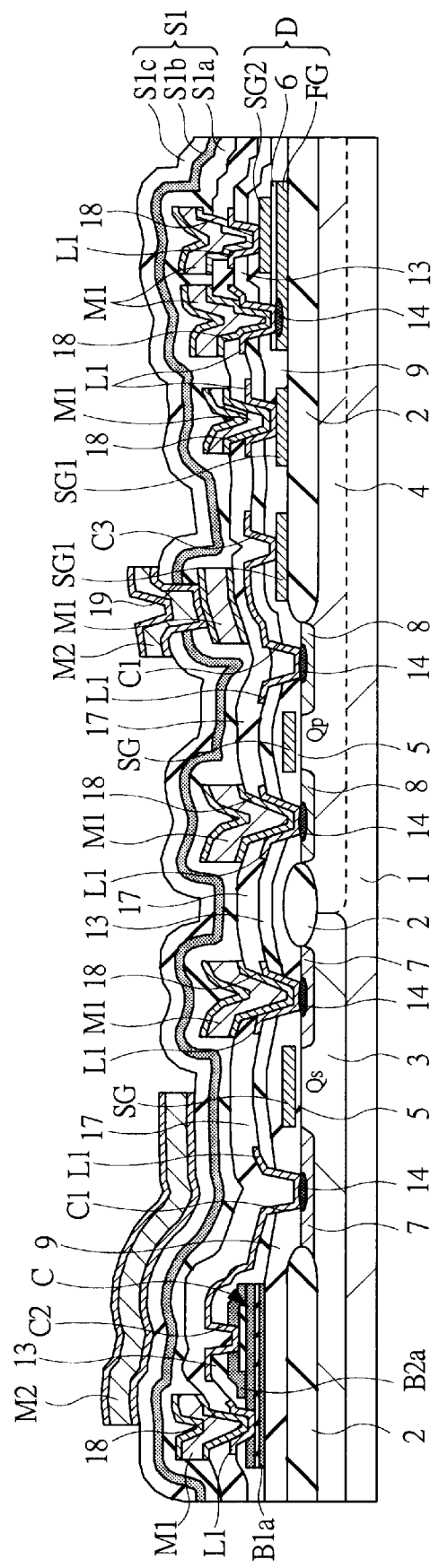
FIG. 16 is a cross-sectional view of a principal portion of a substrate for showing the manufacturing method of a semiconductor integrated circuit device that is the first embodiment of the present invention.

Next, a TiN film, an Al film and a TiN film are sequentially deposited on the interlayer insulating film S1 and in each interior of the contact holes 19. These laminating films are patterned to thereby form the second layer wirings M2 (FIG. 16).

Here, although the PZT film S1b serving as a barrier film is removed by forming the contact holes 19, the TiN film (or barrier metal film) is formed in the contact holes 19 as described above. This TiN film has a barrier property of preventing hydrogen or the like from passing therethrough. It is, therefore, possible to prevent hydrogen or the like from entering the inside thereof through each of the contact holes 19. That is, the PZT film S1b or the TiN film covers the semiconductor substrate 1, so that hydrogen or $H_2O$ can be prevented from entering the capacitive insulating film 11a by this film.

Figure 17:
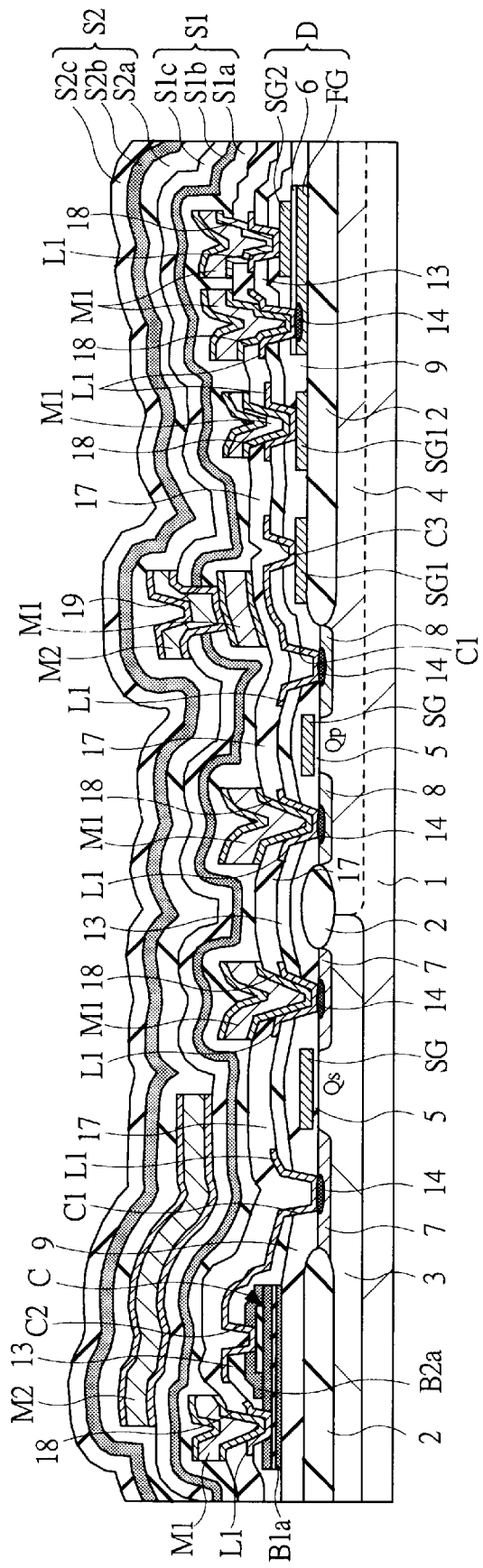
FIG. 17 is a cross-sectional view of a principal portion of a substrate for showing the manufacturing method of a semiconductor integrated circuit device that is the first embodiment of the present invention.

Next, as shown in FIG. 17, a TEOS film S2a, a PZT film S2b serving as a barrier film, and a TEOS film S2c are sequentially deposited on the second layer wirings M2 and the interlayer insulating film S1, and thereby an interlayer insulating film S2 is formed, which consists of the above-stated films. This PZT film S2b is an amorphous film having a Pb composition ratio of $1+\alpha_3$ similarly to the PZT film S1b.

As can be seen, in this embodiment, since the PZT film S2b serving as a barrier film is formed in the interlayer insulating film S2, it is possible to prevent hydrogen or $H_2O$ from entering the capacitive insulating film 11a. That is, the PZT film Sb2 serves as a barrier and prevents hydrogen or $H_2O$ existing in the TEOS film S2c and a TEOS film S3a to be described later, from passing therethrough. Particularly, since the PZT film S2b is amorphous and has no grain boundary, it can prevent hydrogen or $H_2O$ from passing therethrough more effectively than the crystallized PZT film.

Further, since hydrogen, $H_2O$ or the like existing in the TEOS films S2a and S2c combines with oxygen atoms included in the PZT film S2b, it is possible to prevent hydrogen or $H_2O$ from entering the capacitive insulating film 11a. It is also possible to prevent hydrogen or $H_2O$ from reacting with oxygen atoms included in the capacitive insulating film 11a. That is, the PZT film S2b itself becomes a sacrifice, and it is possible to reduce influence of hydrogen or the like relative to the capacitive insulating film 11a.

Moreover, the PZT film S1b or S2b is not crystallized but remain amorphous. Due to this, in comparison with the crystallized PZT film, it is possible to keep permittivity of thereof low. By keeping the permittivity of the PZT film S1b or S2b low, it is possible to reduce respective parasitic capacities between the first layer wirings M1 and the second layer wirings M2 and between the second layer wirings M2 and the third layer wiring M3, and therefore to achieve a high speed of circuit operation in the memory cell.

Next, a resist film (not shown) having opening portions in desired regions located on the second layer wirings M2 is formed on the interlayer insulating film S2. By using this resist film as a mask and by etching the interlayer insulating film S2, a contact hole 20 is formed.

Then, a TiN film, an Al film and a TiN film are sequentially deposited on the interlayer insulating film S2 and in an interior of the contact hole 20. Next, by patterning these films, the third layer wiring M3 is formed (see FIG. 18).

Here, although the PZT film S2b serving as a barrier film is removed by forming the contact hole 20, the TiN film (or a barrier metal film) is formed in the contact hole 20 as stated above. This TiN film has such a barrier characteristic that hydrogen or the like can not pass therethrough, and thereby it is possible to prevent hydrogen or the like from entering the inside thereof through the contact holes 20. That is, the PZT film S2b or the TiN film covers the semiconductor substrate 1, and thereby it is possible to prevent hydrogen or $H_2O$ from entering the capacitive insulating film 11a by this film.

Figure 18:
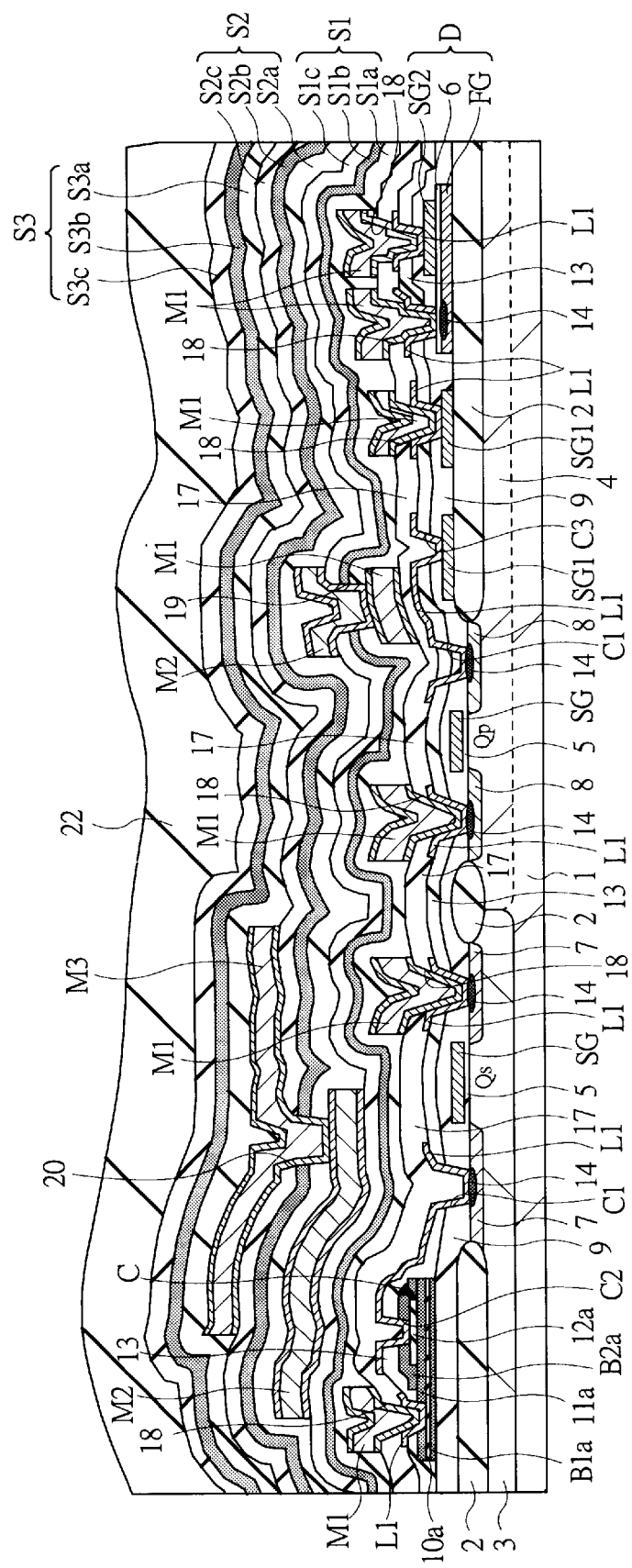
FIG. 18 is a cross-sectional view of a principal portion of a substrate for showing the manufacturing method of a semiconductor integrated circuit device that is the first embodiment of the present invention.

Next, as shown in FIG. 18, a TEOS film S3a, a PZT film S3b used as a barrier film, and an a TEOS film S3c are sequentially deposited on the third layer wiring M3 and the interlayer insulating film S2, and thereby an interlayer insulating film S3 is formed, which consists of the above-stated films. This PZT film S3b is also an amorphous film having a Pb composition ratio of $1+\alpha_3$ when being formed, similarly to the PZT film S1b. Next, a PIQ film 22 is formed on the interlayer insulating film S3. The interlayer insulating film S3 and the PIQ film 22 are formed on the uppermost layer wiring M3 and are used as films (passivation films) for protecting elements and wirings provided on the semiconductor substrate.

As can be seen, in this embodiment, since the PZT film S3b, serving as a barrier film is formed in the interlayer insulating film S3, it is possible to prevent hydrogen or $H_2O$ 0from entering the capacitive insulating film 11a. That is, the PZT film S3b serves as a barrier and prevents hydrogen or $H_2O$ existing in the TEOS film S3 and the PIQ film from entering the inside thereof.

Further, since hydrogen, $H_2O$ or the like existing in the TEOS films S3a and S3c combines with oxygen atoms included in the PZT film S3b, it is possible to prevent hydrogen or $H_2O$ from entering the capacitive insulating film 11a. It is also possible to prevent hydrogen or $H_2O$ from reacting with oxygen atoms included in the capacitive insulating film 11a. That is, the PZT film S3b itself becomes a sacrifice, and thereby it is possible to reduce influence of hydrogen or the like relative to the capacitive insulating film 11a.

In the present embodiment, TEOS films or the like are used to form the interlayer insulating films S1, S2 and the like, but may also be formed by using SOG films or the like. Since a SOG film contains much moisture, forming the barrier layers S1b and S2b and the like in the interlayer insulating films S1, S2 causes much effect.

And, in this embodiment, although the PZT films are used as the barrier layers S1b and S2b in the interlayer insulating films S1, a $Al_2O_3$ film or the like may be used as a barrier layer. In this $Al_2O_3$ film, diffusive speed of hydrogen or $H_2O$ is slow, so that it is possible to reduce influence of hydrogen or the like relative to the capacitive insulating film 11a.

(Second Embodiment)

In the first embodiment, after forming the shielding film B2a, the PZT film 11, the laminating film 10 consisting of the Ti film and the Pt film, and the PZT film B1 are etched. However, by forming a PZT film B3 after this etch, a side wall PZT film B3a may be formed in side walls of the lower electrode 10a.

Figure 19A:
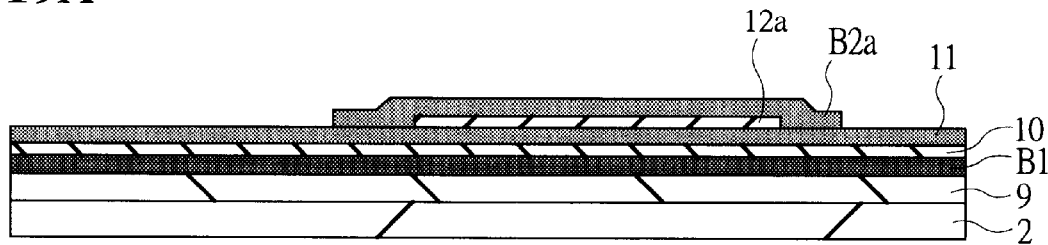
FIG. 19A is a cross-sectional view of a principal portion of a substrate for showing a manufacturing method of a semiconductor integrated circuit device that is a second embodiment of the present invention.

First, a semiconductor substrate shown in FIG. 4 is prepared. The steps of forming the semiconductor substrate shown in FIG. 4 are the same as the case of the first embodiment, and thereby description thereof will be omitted. FIG. 19A is an enlarged view of a vicinity of the shielding film B2a (capacitor C part) in the semiconductor substrate shown in FIG. 4. As shown in FIG. 19A, a PZT film B1, a laminating film 10 consisting of a Ti film and a Pt film, and a PZT film 11 are formed on the BPSG film 9. Also, the upper electrode 12a is formed on this PZT film 11, and an upper portion and a side portion of the upper electrode 12a are covered with the shielding film B2a.

Figure 19B:
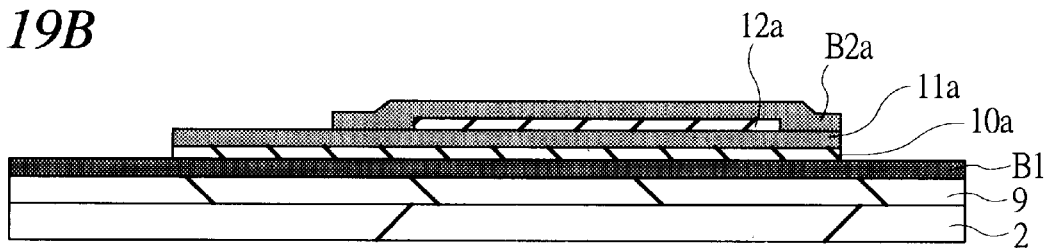
FIG. 19B is a cross-sectional view of a principal portion of a substrate for showing the manufacturing method of a semiconductor integrated circuit device that is the second embodiment of the present invention.

Next, as shown in FIG. 19B, by plasma-etching the PZT film 11, and the laminating film 10 consisting of the Ti film and the Pt film, a capacitive insulating film 11a and a lower electrode 10a are formed below the upper electrode 12a. At this time, the side portion of the lower electrode 10a are not covered with the shielding film B2a.

Figure 19C:
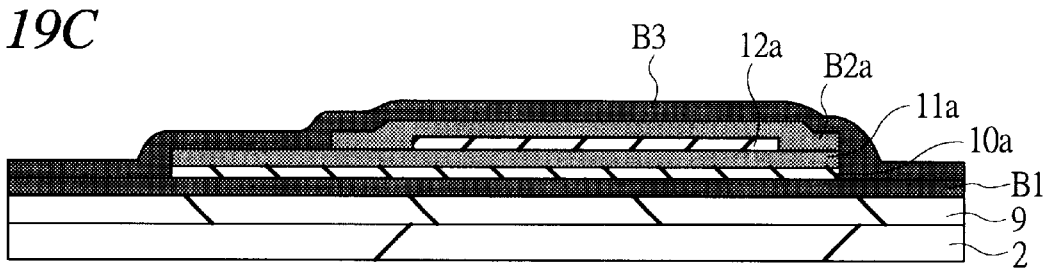
FIG. 19C is a cross-sectional view of a principal portion of a substrate for showing the manufacturing method of a semiconductor integrated circuit device that is the second embodiment of the present invention.

Then, as shown in FIG. 19C, a PZT film B3 is deposited on a region including a formation region of the lower electrode 10a by a sputtering method.

Here, the PZT film B3 is also an amorphous film having a Pb composition ratio of $1+\alpha_2$ ($\alpha_2>\alpha_1$) when being formed, similarly to the PZT films B1 and B2.

Next, by using a pattern slightly smaller than the lower electrode 10a, the PZT film B3 located above the lower electrode 10a is removed. Following this, by using a pattern slightly larger than the lower electrode 10a, the PZT films B3 and B1 located around the lower electrode 10a are removed.

Through the above-described steps, it is possible to form a side wall PZT film B3a covering the side walls of the lower electrode 10a.

Figure 19D:
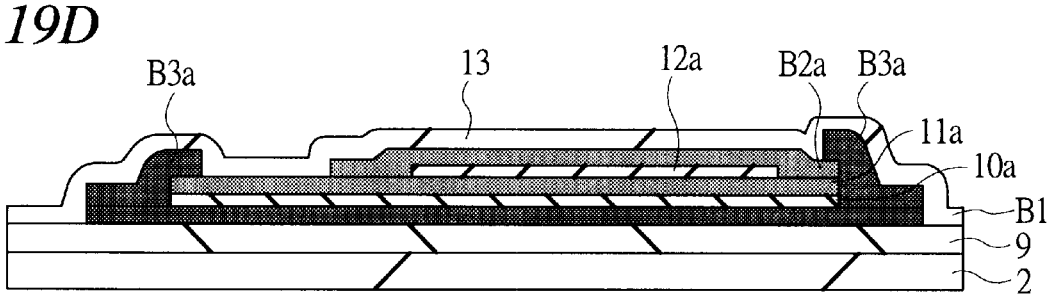
FIG. 19D is a cross-sectional view of a principal portion of a substrate for showing the manufacturing method of a semiconductor integrated circuit device that is the second embodiment of the present invention.

Next, as shown in FIG. 19D, a TEOS film 13 is deposited by a CVD method. Since steps following this are the same as the steps of the first embodiment described with reference to FIGS. 7 to 18, description thereof will be omitted.

As can be seen, in the second embodiment, since the side walls of the lower electrode 10a is covered with the side wall PZT film B3a, it is also possible to prevent $H_2$ or $H_2O$ from entering the capacitive insulating film from the side portions of the lower electrode 10a, in addition to effects generated by the shielding films B1a and B2a described in the first embodiment.

(Third Embodiment)

In the second embodiment, although the side wall PZT film B3a, is formed by patterning, the side wall PZT film may be also formed by anisotropic etch.

Figure 20A:
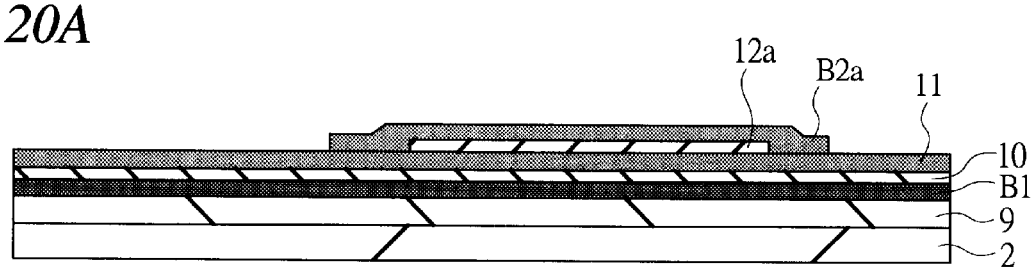
FIG. 20A is a cross-sectional view of a principal portion of a substrate for showing a manufacturing method of a semiconductor integrated circuit device that is a third embodiment of the present invention.

First, a semiconductor substrate shown in FIG. 4 is prepared. Since steps of forming the semiconductor substrate shown in FIG. 4 are the same as the case of the first embodiment, description thereof will be omitted. FIG. 20A is an enlarged view of a vicinity of the shielding film B2a (capacitor C part) of the semiconductor substrate shown in FIG. 4. As shown in FIG. 20A, a PZT film B1, a laminating film 10 consisting of a Ti film and a Pt film, and the PZT film 11 are formed on a BPSG film 9. Also, an upper electrode 12a is formed on the PZT film 11, and an upper and side portions of the upper electrode 12a are covered with a shielding film B2a.

Figure 20B:
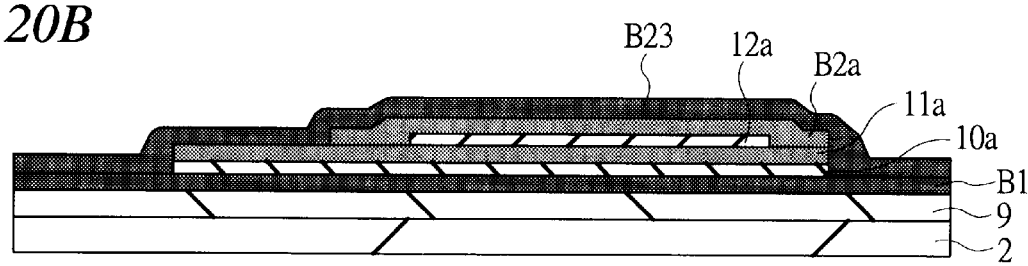
FIG. 20B is a cross-sectional view of a principal portion of a substrate for showing the manufacturing method of a semiconductor integrated circuit device that is the third embodiment of the present invention.

Next, as shown in FIG. 20B, by plasma-etching the PZT film 11 and the laminating film 10 of the Ti film and the Pt film, a capacitive insulating film 11a and a lower electrode 10a are formed below the upper electrode 12a. At this time, the side portions of the lower electrode 10a are not covered with the shielding film B2a.

Subsequently, a PZT film B23 is deposited in a region including a formation region of the lower electrode 10a by a sputtering method.

Here, the PZT film 23 is also an amorphous film having a Pb composition ratio of $1+\alpha_2$ ($\alpha_2>\alpha_1$) when being formed, similarly to the PZT films B1 and B2.

Figure 20C:
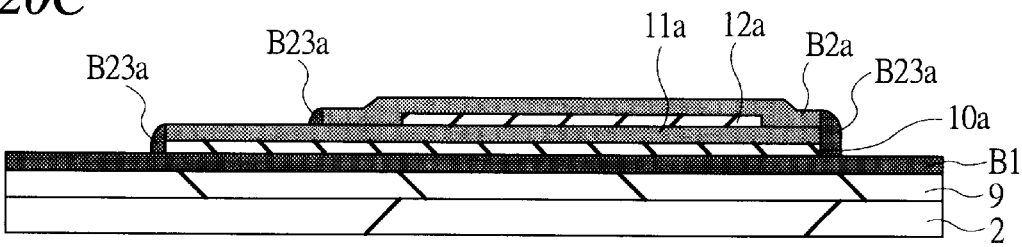
FIG. 20C is a cross-sectional view of a principal portion of a substrate for showing the manufacturing method of a semiconductor integrated circuit device that is the third embodiment of the present invention.

Next, as shown in FIG. 20C, by anisotropically etching the PZT film B23, a side wall PZT film B23a is formed on the side walls of the lower electrode 10a. At this time, the side wall PZT film B23a is also formed on the side walls of the shielding film B2a.

Following this, by etching the PZT film B1, a shielding film B1a is formed below the side wall PZT film B23a and the lower electrode 10a.

Figure 20D:
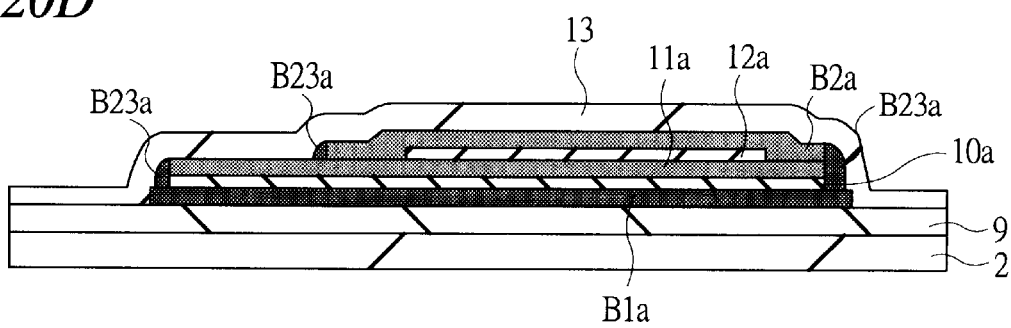
FIG. 20D is a cross-sectional view of a principal portion of a substrate for showing the manufacturing method of a semiconductor integrated circuit device that is the third embodiment of the present invention.

Next, as shown in FIG. 20D, a TEOS film 13 is deposited by a CVD method. Since steps following this are the same as the case of the first embodiment described with reference to FIGS. 7 to 18, description thereof will be omitted.

As can be seen, in the third embodiment, since the side walls of the lower electrode 10a is covered with the side wall PZT film B23a, it is possible to prevent $H_2$ or $H_2O$ from entering the capacitive insulating film 11a from the side portions of the lower electrode 10a, similarly to the case of the second embodiment.

(Fourth Embodiment)

In the second embodiment, although a PZT film B3 on the lower electrode 10a is removed, it is also possible to omit such the step of removing the PZT film B3.

Figure 21A:
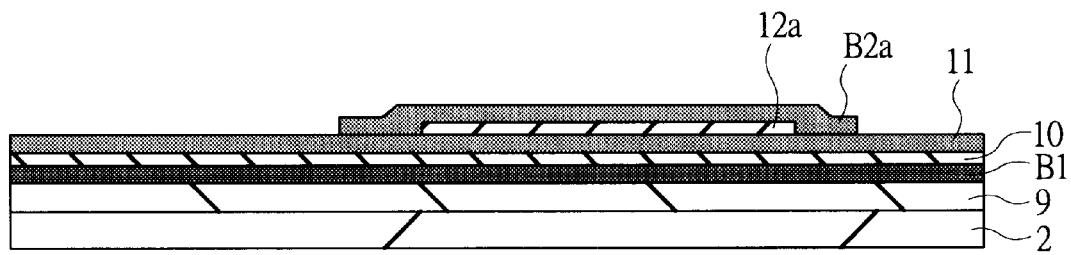
FIG. 21A is a cross-sectional view of a principal portion of a substrate for showing a manufacturing method of a semiconductor integrated circuit device that is a fourth embodiment of the present invention.

First, a semiconductor substrate shown in FIG. 4 is prepared. Since steps of forming the semiconductor substrate shown in FIG. 4 are the same as the case of the first embodiment, description thereof will be omitted. FIG. 21A is an enlarged view of a vicinity of the shielding film B2a (capacitor C part) of the semiconductor substrate shown in FIG. 4. As shown in FIG. 21A, a PZT film B1, a laminating film 10 consisting of a Ti film and a Pt film, and a PZT film 11 are formed above a BPSG film 9. Also, an upper electrode 12a is formed on this PZT film 11a, and an upper portion and a side portion of the upper electrode 12a are covered with a shielding film B2a.

Figure 21B:
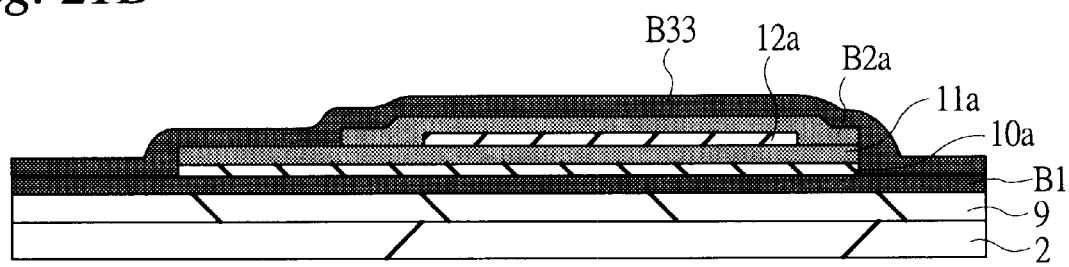
FIG. 21B is a cross-sectional view of a principal portion of a substrate for showing the manufacturing method of a semiconductor integrated circuit device that is the fourth embodiment of the present invention.

Next, as shown in FIG. 21B, by plasma-etching the PZT film 11 and the laminating film 10 consisting of the Ti film, and the Pt film, a capacitive insulating film 11a and a lower electrode 10a are formed below the upper electrode 12a. At this time, the side portions of the lower electrode 10a are not covered with the shielding film B2a.

Following this, a PZT film B33 is deposited in a region including a formation region of the lower electrode 10a by a sputtering method.

Here, the PZT film B33 is also an amorphous film having a Pb composition ratio of $1+\alpha_2$ ($\alpha_2>\alpha_1$) when being formed, similarly to the PZT films B1 and B2.

Figure 21C:
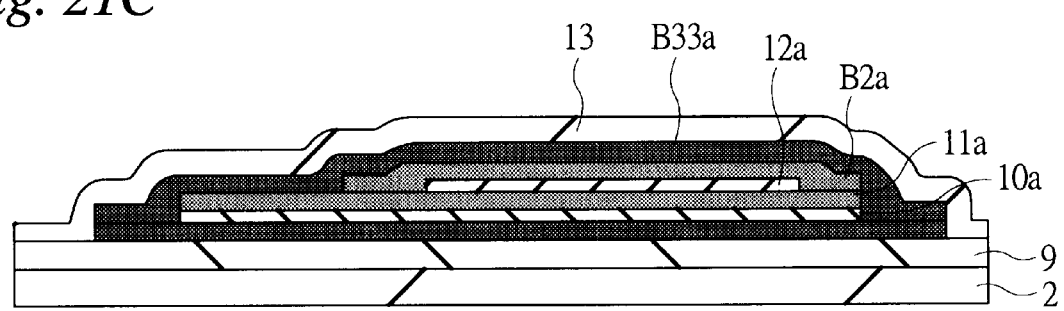
FIG. 21C is a cross-sectional view of a principal portion of a, substrate for showing the manufacturing method of a semiconductor integrated circuit device that is the fourth embodiment of the present invention.

Next, as shown in FIG. 21C, by using a pattern slightly larger than the lower electrode 10a, the PZT films B33 and B1 located around the lower electrode 10a are removed.

Through the above-described steps, it is possible to form a shield PZT film B33a covering the side walls of the shielding film B2a and the lower electrode 10a.

Next, a TEOS film 13 is deposited by a CVD method. Since steps following this are the same as the case of the first embodiment described with reference to FIGS. 7 to 18, description thereof will be omitted.

As can be seen, in the fourth embodiment, since the side walls of the lower electrode 10a are covered with the shield PZT film B33a, it is also possible to prevent $H_2$ or $H_2O$ from entering the capacitive insulating film 11a from the side portions of the lower electrode 10a, similarly to the case of the second embodiment.

In this embodiment, the shielding film B33a remains on the upper electrode 12a, so that it is possible to form the upper electrode 12a and the shielding film B2a located thereon by using the same mask.

(Fifth Embodiment)

The side walls of the lower electrode 10a may be covered with a capacitive insulating film 11a as follows.

Figure 22A:
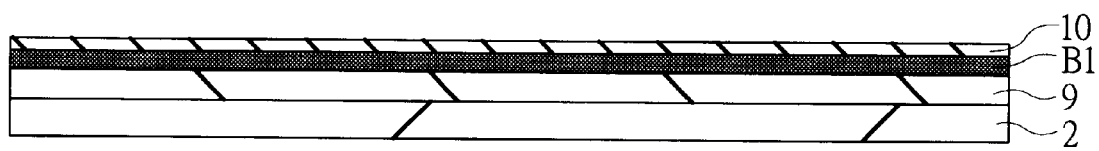
FIGS. 22–22C are cross-sectional views of a principal portion of a substrate for showing a manufacturing method of a semiconductor integrated circuit device that is a fifth embodiment of the present invention.

First, a semiconductor substrate shown in FIG. 1 is prepared. Since steps of forming the semiconductor substrate shown in FIG. 4 are the same as the case of the first embodiment, description thereof will be omitted. FIG. 22A is an enlarged view of a formation region of a capacitor C part to be formed on the semiconductor substrate shown in FIG. 1. As shown in FIG. 22A, a PZT film B1 and a laminating film 10 consisting of a Ti film and a Pt film are formed on a BPSG film 9, similarly to the first embodiment.

Figure 22B:
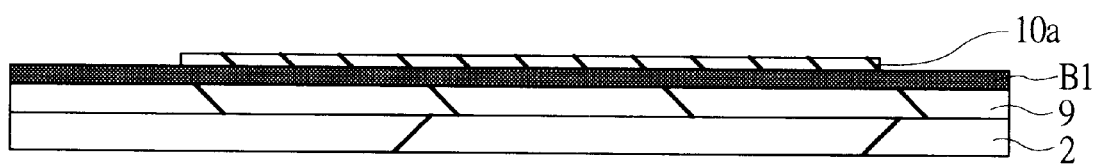

Next, as shown in FIG. 22B, by patterning the laminating film 10 consisting of the Ti film and the Pt film, a lower electrode 10a is formed.

Figure 22C:
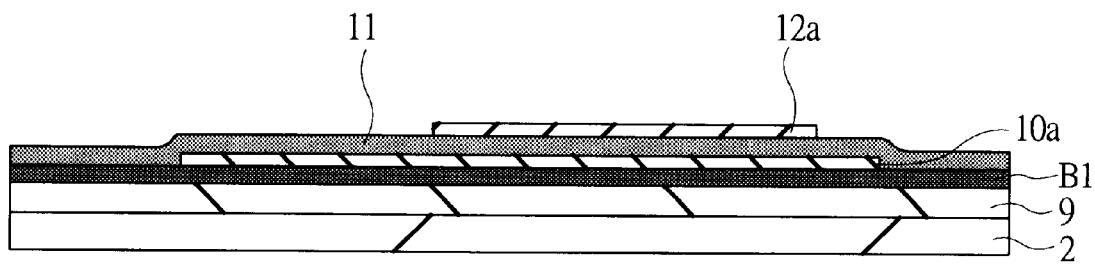

Following this, as shown in FIG. 22C, a PZT film 11 to be used as a capacitive insulating film 11a is deposited on the PZT film B1 and in a portion located on the lower electrode 10a. At this time, the side walls of the lower electrode 10a are covered with the PZT film 11 to be used as the capacitive insulating film 11a. Then, by depositing a Pt film on the PZT film 11 and by pattering it, an upper electrode 12a is formed.

Figure 23A:
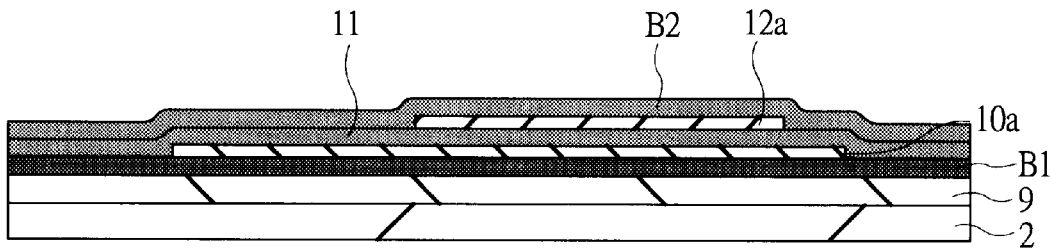
FIGS. 23A–23C are cross-sectional views of a principal portion of a substrate for showing the manufacturing method of a semiconductor integrated circuit device that is the fifth embodiment of the present invention.

Next, as shown in FIG. 23A, a PZT film B2 to be used as a shielding film B2a is deposited on the PZT film 11 and in portions located on the upper electrode 12a. At this time, the side walls of the upper electrode 12a are covered with the PZT film B2.

Figure 23B:
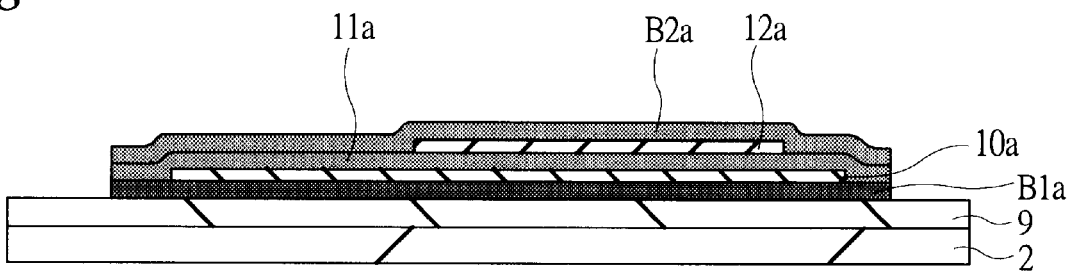
Figure 23C:
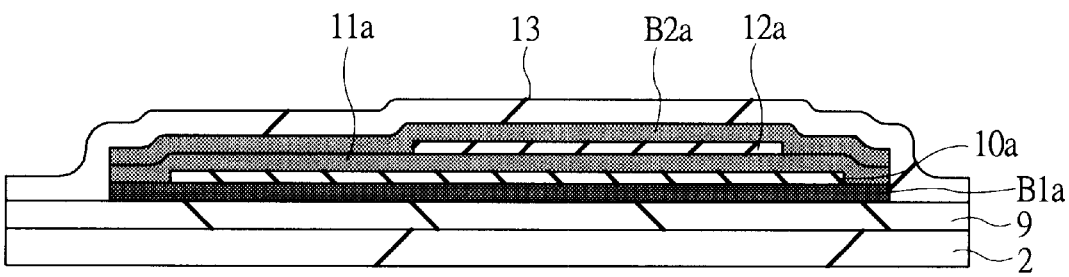

As shown in FIG. 23B, by patterning the PZT films B2 and B11, a shielding film B2a covering the upper and side portions of the upper electrode 12a, a capacitive insulating film 11a covering the side portions of the lower electrode 10a, and a shielding film B1a covering a bottom surface of the lower electrode 10a are formed, respectively.

Here, each of the PZT films B2, 11 and B1 is a amorphous film having a Pb composition ratio of $1+\alpha_2$ ($\alpha_2 > \alpha_1$) when being formed.

Next, a TEOS film 13 is deposited by a CVD method. Since steps following this are the same as the case of the first embodiment described with reference to FIGS. 7 to 18, description thereof will be omitted.

As can be seen, in the fifth embodiment, since the side portions of the lower electrode 10a are covered with the capacitive insulating film 11a, the upper electrode 12a and the lower electrode 10a can be covered with these three PZT films (B21, 11a and B1a).

(Sixth Embodiment)

In the first embodiment, although the PZT film S1b is formed even on the n-type well 4 which is the peripheral circuit region (see, for example, FIG. 4), the PZT film S1b located on the n-type well 4 serving as the peripheral circuit region may be removed by etch. The same thing is true for the PZT film S2b. A manufacturing method of a semiconductor integrated circuit device according to the present embodiment further comprises a step of removing the PZT film S1b located on the n-type well 4 which is the peripheral circuit region, by etch after formation of the PZT film S1b, and the other steps are the same as the cases of the above-mentioned embodiments. And so, description thereof will be omitted.

Figure 24:
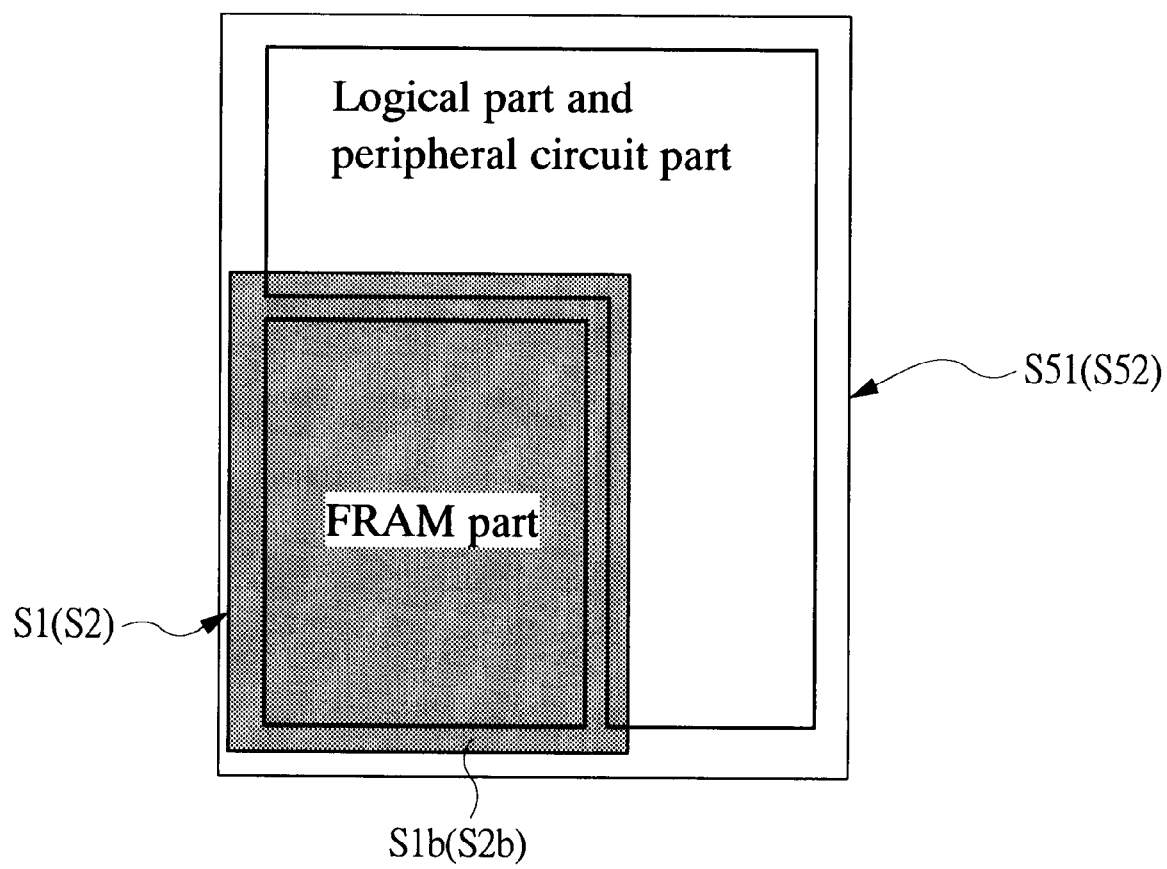
FIG. 24 is a plane view of a principal portion of a substrate for showing a manufacturing method of a semiconductor integrated circuit device that is a sixth embodiment of the present invention.

FIG. 24 is a plan view illustrating a semiconductor integrated circuit substrate after an interlayer insulating film S1 (S2) is formed. As shown in FIG. 24, the interlayer insulating film S1 (S2) having a PZT film S1b (S2b) is formed on a memory cell formation region in which an FeRAM memory cell is formed, and an interlayer insulating film S51 (S52) which does not include the PZT film S1b (S2b) is formed on a peripheral circuit part and a logic part.

As can be seen, in the present embodiment, since the PZT film S1b (S2b) located on the peripheral circuit part and the logic part is removed, it is possible to reduce a parasitic capacity generated by the PZT film. It is also possible to achieve a high speed of circuit operation in the peripheral circuit part and the logic part.

Figure 25:
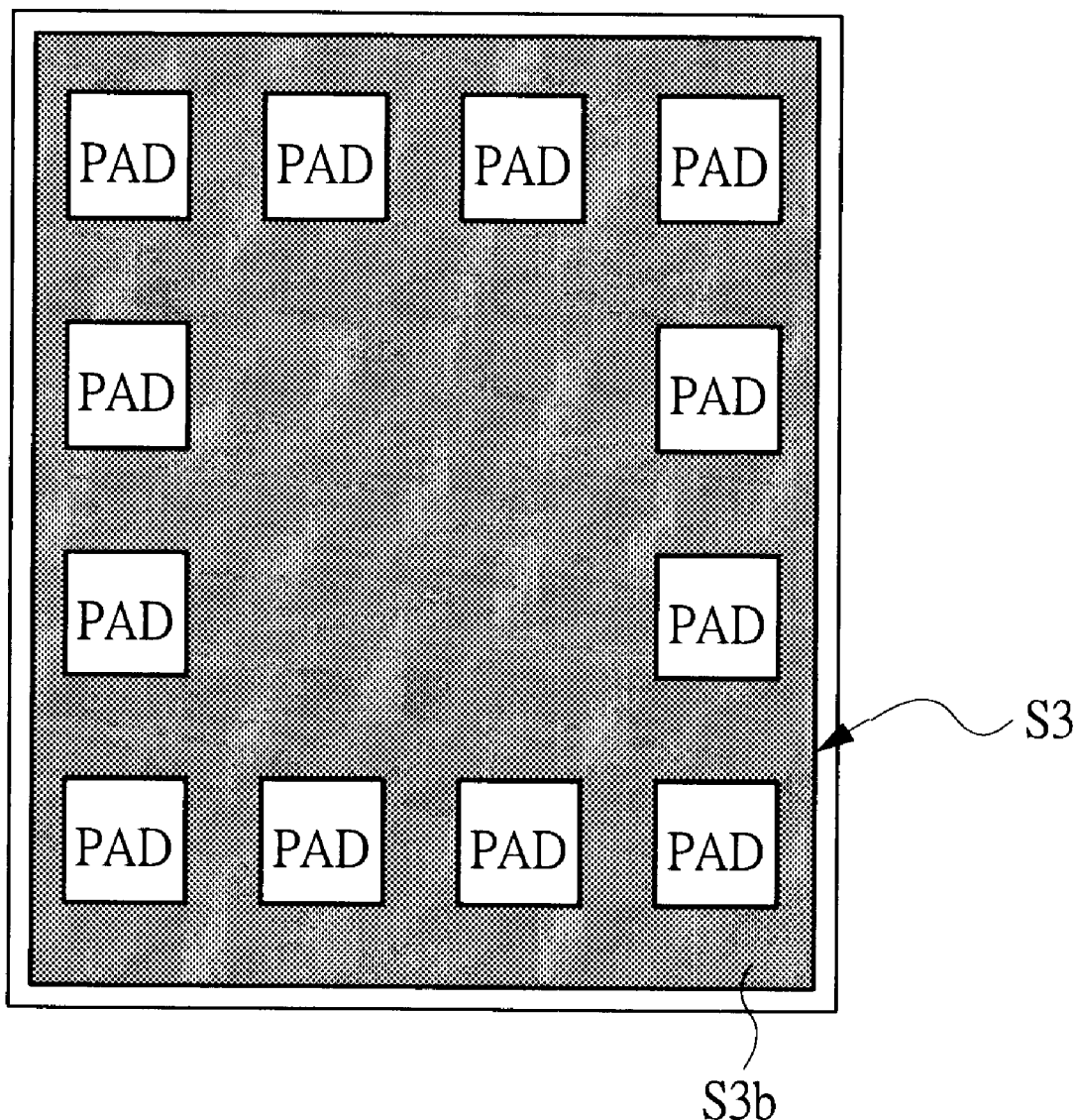
FIG. 25 is a plane view of a principal portion of a substrate for showing the manufacturing method of a semiconductor integrated circuit device that is the sixth embodiment of the present invention.

FIG. 25 is a plan view showing a semiconductor integrate circuit substrate generated after an interlayer insulating film S3 is formed. As shown in FIG. 25, the interlayer insulating film S3 having a PZT film S3b is formed not only on the peripheral circuit part and the logic part but also on the memory cell formation region. It is noted, however, that the interlayer insulating film S3 (PZT film S3b) provided on the third layer wiring M3 is removed and pad parts PAD are formed.

As can be seen, in the present embodiment, the interlayer insulating film S3 having the PZT film S3b is formed not only on the peripheral circuit part and the logic part but also on the memory cell formation region in the uppermost layer wiring (corresponding to the third layer wiring M3 in this case). It is, therefore, possible to sufficiently protect the semiconductor integrated circuit device. It is noted that since no wiring is formed on the interlayer insulating film S3, a parasitic capacity generated by the PZT film included in the interlayer insulating film S3 is out of question.

(Seventh Embodiment)

Figure 26:
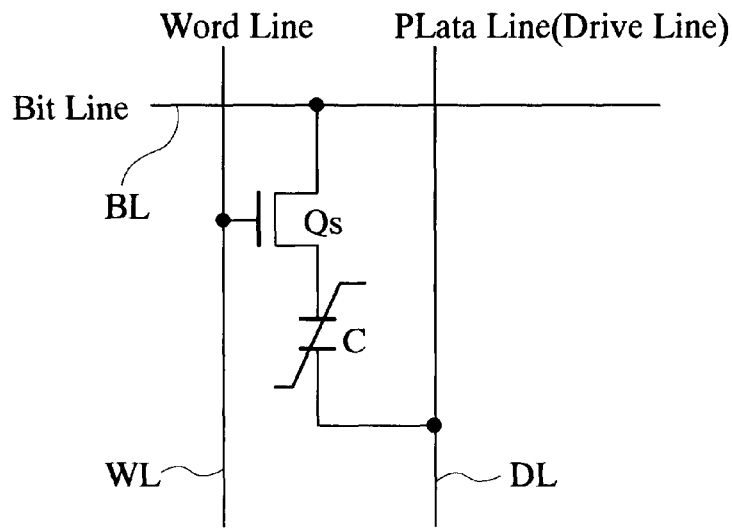
FIG. 26 is a view shows a circuit arrangement of a FeRAM memory cell that is a seventh embodiment of the present invention.

The circuit arrangement of the FeRAM memory cell described in the first embodiment will now be described. As described in the first embodiment, the FeRAM memory cell has the capacitor C and the MISFET Qs connected in series thereto, and, as shown in FIG. 26, one cell (1T1C cell) can be constituted by a single capacitor C and an MISFET Qs connected in series thereto. In this case, the gate electrode of the MISFET Qs is connected to a word line WL, and the source and drain regions of the MISFET Qs, which are not connected to the capacitor C, are connected to a bit line BL. Also, an electrode of the capacitor C, which is not connected to the MISFET Qs, is connected to a drive line DL.

Figure 27:
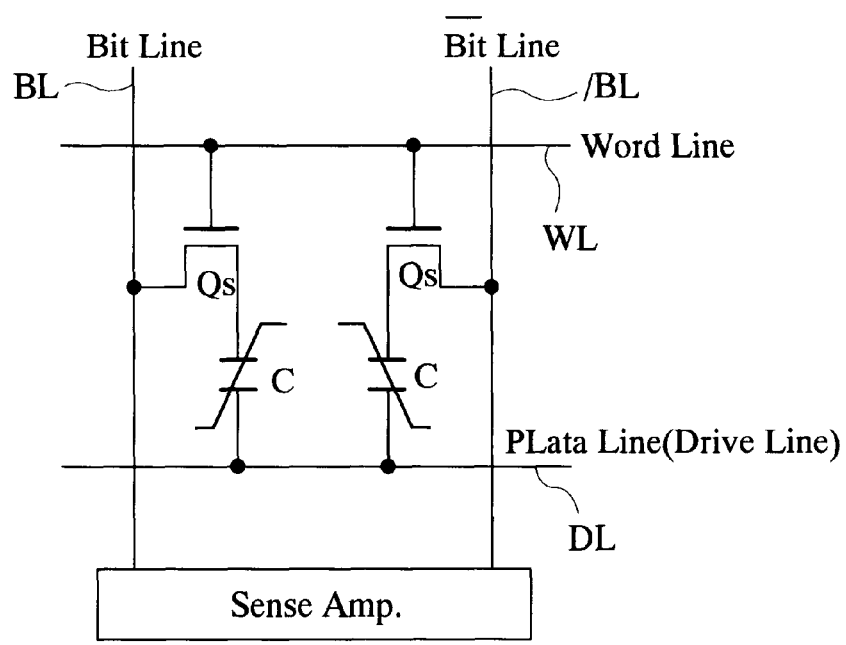
FIG. 27 is a view shows another circuit arrangement of a FeRAM memory cell that is a seventh embodiment of the present invention.

In addition, as shown in FIG. 27, one FeRAM memory cell (2T2C cell) may be constituted by two capacitors C and two MISFETs Qs. In this case, too, each gate electrode of the two MISFETs Qs is connected to a word line WL, and each electrode of the two capacitors C, which is not connected to the MISFETs Qs, is connected to a drive line DL. Also, among two sets of source and drain regions of the two MISFETs Qs, which are not connected to the capacitors C, one set of source and drain regions is connected to a bit line BL and the other set is connected to a bar bit line/BL.

(Eighth Embodiment)

In the FeRAM memory cell described in the first embodiment, the capacitor C is formed on the wide field oxide film 2 above the p-type well 3 (see FIG. 6). But, a capacitor C may be formed on the n-type semiconductor region 7 (source and drain) of the MISFET Qs constituting the FeRAM memory cell.

Figure 28:
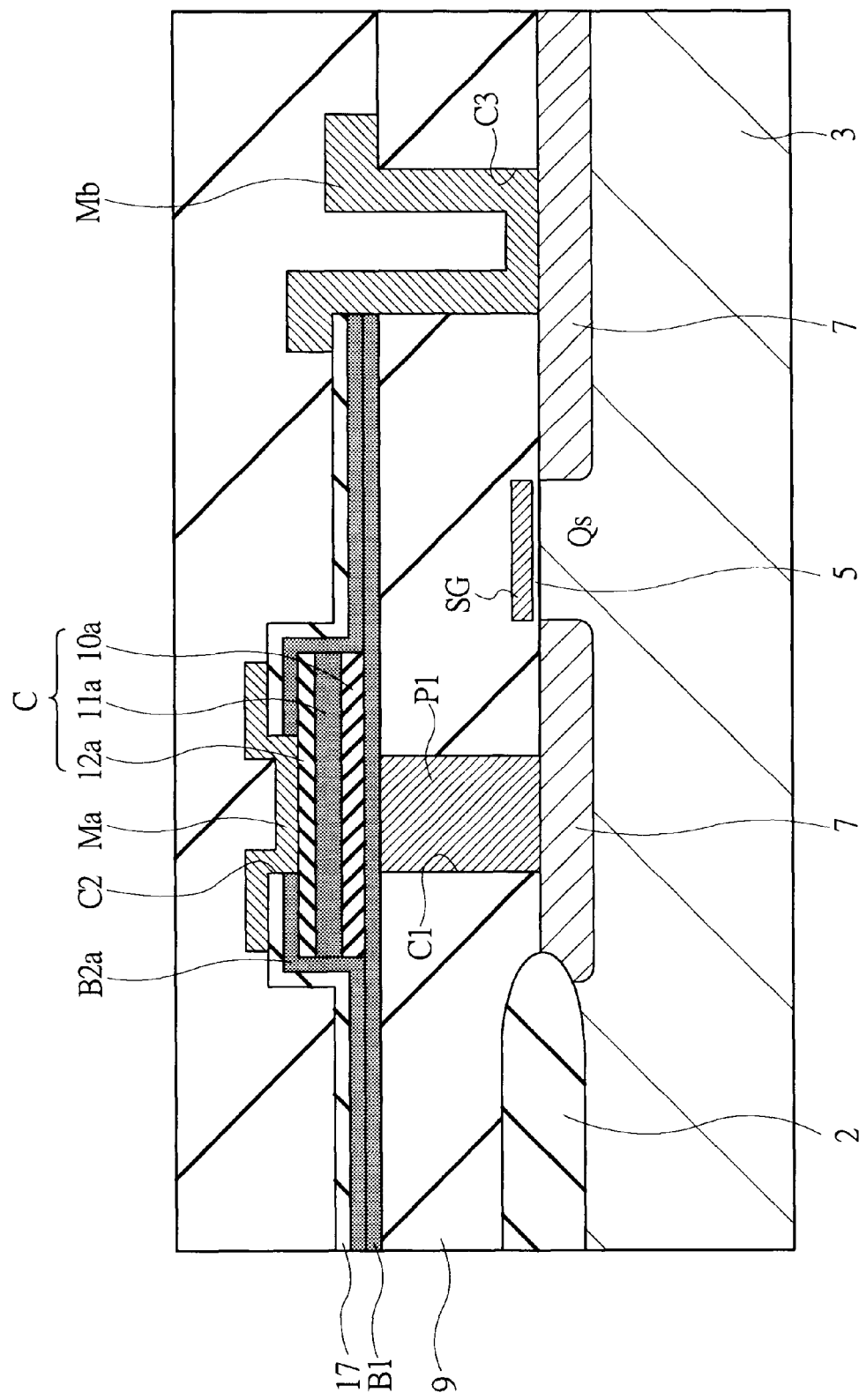
FIG. 28 is a cross-sectional view of a principal portion of a substrate showing a FeRAM memory cell that is an eighth embodiment of the present invention.

FIG. 28 illustrates an example of a semiconductor integrated circuit having a capacitor C formed on an n-type semiconductor region 7 (source and drain). As shown in FIG. 28, a plug P1 is formed on the n-type semiconductor region 7 of the MISFET Qs. This plug P1 is formed by embedding a conductive film in a contact hole C1 which is formed by removing both a BPSG film 9 on the source and drain regions of the MISFET Qs and a PZT film B1 thereon.

A capacitor C is formed above the plug P1. This capacitor C is formed by sequentially depositing a laminating film 10 consisting of a Ti film and a Pt film, a PZT film 11, and a Pt film 12 on the PZT film B1 and in a portion located on the plug P1 and by patterning these films.

In addition, a PZT film B2 and a TEOS film 17 are formed on the PZT film B1 and in a portion located on an upper electrode 12a, and a contact hole C2 is formed on the upper electrode 12a by removing the PZT film B2 and the TEOS film 17.

A wiring layer Ma is formed on the TEOS film 17 and in an interior of the contact hole C2.

On the other hand, a contact hole C3 is formed on the ntype semiconductor region 7 (source and drain) of the MISFET Qs, which is not connected to the capacitor C, and a wiring layer Mb is formed on the TEOS film 17 and in an interior of the contact hole C3.

Accordingly, the upper electrode 12a and the lower electrode 10a are covered with the PZT films B1 and B2a, and can thereby obtain the same advantage as that of the first embodiment.

Furthermore, in this embodiment, if the capacitor C is formed above the n-type semiconductor region 7 (source and drain) of the MISFET Qs, it is possible to achieve reduction of a cell area of the memory cell. Besides, if this embodiment is applied to the 1T1C cell structure described in the sixth embodiment, reduction in the cell area can be further achieved.

As described above, the inventions made by present inventors has been concretely described in accordance with the embodiments. Needless to say, the present invention is not be limited to the above-stated embodiments and various changes and modifications can be made without departing from the gist thereof.

In the embodiments stated above, in particular, the p-channel type MISFET is formed on the n-type well 4 serving as the peripheral circuit region. Alternatively, an n-channel type MISFET may be formed by forming a p-type well on the peripheral circuit region.

In the embodiments stated above, the laminating film consisting of the Ti film and the Pt film is used as the upper electrode of the capacitor C and the Pt film is used as the lower electrode thereof. But, the present invention is not limited thereto. Alternatively, these electrodes may be made of a single layer film or a laminating layer, wherein the single layer film contains a platinum metal such as Pt, Ir, $IrO_2$, Ru, $RuO_2$ or the like, or an oxide thereof, or a double oxide thereof as a main component, and wherein the laminating layer is constituted by two or more than conductive films selected from these.

Moreover, in the above-mentioned embodiments, although the PZT film is used as the ferroelectric film for the capacitive insulating film, the present invention is not limited thereto and may use, for example, a dielectric film which contains Pb included in PLZT ($Pb_{1-x}La_x(Zr_yTi_2)O_3$) or the like and which has one belonging in a range between a high-dielectric-constant substance and a ferroelectric substance, as a main component.

Of inventions disclosed by the present application, advantages obtained by representative ones will be briefly described as follows.

According to the present invention, the first and second shielding films are formed on the upper portion of the upper electrode of the capacitor or on the lower portion of the lower electrode. Therefore, it is possible to prevent $H_2$ or $H_2O$ from entering the upper or lower portions of the capacitor and prevent characteristics of the high-dielectric-constant material or ferroelectric material (capacitive insulating film) from being degraded in the capacitor. In addition, the first and second shielding films can reduce diffusion of a component, e.g., lead included in the capacitive insulating film. And, if the lead composition ratio of each of the first and second shielding films is set higher than that of the capacitive insulating film, then Pb diffused from the inside of the capacitive insulating film can be compensated by Pb included in the first and second shielding films, so that it is possible to prevent the characteristics of the capacitive insulating film from being degraded. As a result, the characteristics of the FeRAM memory cell can be improved.

Further, according to the present invention, the barrier layer provided in the interlayer insulating film can prevent $H_2$ or $H_2O$ from entering the upper portion of the capacitor and prevent the characteristics of the capacitive insulating film from being degraded in the capacitor. As a result, the characteristics of the FeRAM memory cell can be improved.

Moreover, according to the present invention, it is possible to manufacture a semiconductor integrated circuit device capable of preventing the characteristics of the capacitive insulating film from being degraded in the capacitor.

What is claimed is:

1. A semiconductor integrated circuit device having an information transfer MISFET formed on a main surface of a semiconductor substrate, and a capacitor connected in series to said information transfer MISFET, said device comprising:

(a) said information transfer MISFET constituted by a gate insulating film formed on said semiconductor substrate, and a gate electrode formed on an upper portion thereof, and source and drain regions formed in the semiconductor substrate located at both sides of said gate electrode;

(b) said capacitor constituted by a lower electrode composed of a first conductive layer, and a capacitive insulating film formed on said lower electrode and made of one of a high-dielectric-constant material and a ferroelectric material, and an upper electrode composed of a second conductive film and electrically connected to one of said source and drain regions;

(c) a first shielding film formed under said lower electrode, and a second shielding film formed on said upper electrode; and (d) said capacitive insulating film and said first and second shielding films being ferroelectric materials containing lead, and a lead composition ratio of each of said first and second shielding films being higher than that of said capacitive insulating film.

2. A semiconductor integrated circuit device having an information transfer MISFET formed on a main surface of a semiconductor substrate, and a capacitor connected in series to said information transfer MISFET, said device comprising:

(a) said information transfer MISFET constituted by a gate insulating film formed on said semiconductor substrate, and a gate electrode formed on an upper portion thereof,
and source and drain regions formed in the semiconductor substrate located at both sides of said gate electrode;

(b) said capacitor constituted by a lower electrode composed of a first conductive layer, and a capacitive insulating film formed on said lower electrode and made of one of a high-dielectric-constant material and a ferroelectric material, and an upper electrode composed of a second conductive film and electrically connected to one of said source and drain regions;

(c) a first shielding film formed under said lower electrode, and a second shielding film formed on said upper electrode; and (d) said capacitive insulating film being a first PZT film ($Pb_{X1}(Zr_{Y}Ti_{Z1})O_3$) and said first and second shielding films being second PZT films ($Pb_{x2}(Zr_{y2}Ti_{Z2})O_3$, where x2>x1.

3. A semiconductor integrated circuit device having an information transfer MISFET formed on a main surface of a semiconductor substrate, and a capacitor connected in series to said information transfer MISFET, said device comprising:

(a) said information transfer MISFET constituted by a gate insulating film formed on said semiconductor substrate, and a gate electrode formed on an upper portion thereof, and source and drain regions formed in the semiconductor substrate located at both sides of said gate electrode;

(b) said capacitor constituted by a lower electrode composed of a first conductive layer, and a capacitive insulating film formed on said lower electrode and made of one of a high-dielectric-constant material and a ferroelectric material, and an upper electrode composed of a second conductive film and electrically connected to one of said source and drain regions;

(c) a first shielding film formed under said lower electrode, and a second shielding film formed on said upper electrode; and (d) said capacitive insulating film and said first and second shielding films being ferroelectric materials containing lead, and a lead composition ratio of each of said first and second shielding films being higher than that of said capacitive insulating film, and said capacitive insulating film being covered with said first and second shielding films.

4. A semiconductor integrated circuit device having an information transfer MISFET formed on a main surface of a semiconductor substrate, and a capacitor connected in series to said information transfer MISFET, said device comprising:

(a) said information transfer MISFET constituted by a gate insulating film formed on said semiconductor substrate, and a gate electrode formed on an upper portion thereof, and source and drain regions formed in the semiconductor substrate on both sides of said gate electrode;

(b) said capacitor constituted by a lower electrode composed of a first conductive layer, and a capacitive insulating film formed on said lower electrode and composed of one of a high-dielectric-constant material and a ferroelectric material, and an upper electrode composed of a second conductive film and electrically connected to one of said source and drain regions;

(c) a shielding film formed under said lower electrode; and (d) said capacitive insulating film and said shielding film being made of ferroelectric materials containing lead, and a lead composition ratio of said shielding film being higher than that of said capacitive insulating film.

5. A semiconductor integrated circuit device having an information transfer MISFET formed on a main surface of a semiconductor substrate, and a capacitor connected in series to said information transfer MISFET, said device comprising:

(a) said information transfer MISFET constituted by a gate insulating film formed on said semiconductor substrate, and a gate electrode formed on an upper portion thereof, and source and drain regions formed in the semiconductor substrate on both sides of said gate electrode;

(b) said capacitor constituted by a lower electrode composed of a first conductive layer, and a capacitive insulating film formed on said lower electrode and composed of one of a high-dielectric-constant material and a ferroelectric material, and an upper electrode composed of a second conductive film and electrically connected to one of said source and drain regions;

(c) a shielding film formed under said lower electrode; and (d) said capacitive insulating film being a first PZT film ($Pb_{x1}(Zr_{y1}Ti_{Z1})O_3$), and said shielding film being a second PZT film ($Pb_{x2}(Zr_{y2}Ti_{z2})O_3$), where x2>x1.

\* \* \* \* \*